United States Patent
Mathuriya et al.

(10) Patent No.: US 12,374,377 B1
(45) Date of Patent: Jul. 29, 2025

(54) FERROELECTRIC OR PARAELECTRIC WIDE-INPUT MINORITY OR MAJORITY GATE BASED LOW POWER ADDER

(71) Applicant: Kepler Computing Inc., San Francisco, CA (US)

(72) Inventors: Amrita Mathuriya, Portland, OR (US); Ikenna Odinaka, Durham, NC (US); Rajeev Kumar Dokania, Beaverton, OR (US); Rafael Rios, Austin, TX (US); Sasikanth Manipatruni, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 929 days.

(21) Appl. No.: 17/467,022

(22) Filed: Sep. 3, 2021

Related U.S. Application Data

(63) Continuation of application No. 17/465,781, filed on Sep. 2, 2021.

(51) Int. Cl.
| | | |
|---|---|---|
| H03K 19/23 | (2006.01) | |
| G11C 11/22 | (2006.01) | |
| H03K 19/18 | (2006.01) | |
| H03K 19/185 | (2006.01) | |
| H03K 19/19 | (2006.01) | |

(52) U.S. Cl.
CPC ...... *G11C 11/2273* (2013.01); *G11C 11/2275* (2013.01); *H03K 19/18* (2013.01); *H03K 19/23* (2013.01)

(58) Field of Classification Search
CPC ............ G11C 11/2273; G11C 11/2275; H03K 19/18; H03K 19/23
See application file for complete search history.

(56) References Cited

U.S. PATENT DOCUMENTS

| | | | |
|---|---|---|---|
| 3,260,863 | A | 7/1966 | Burns et al. |
| 3,524,977 | A | 8/1970 | Wang |
| 5,381,352 | A | 1/1995 | Shou et al. |
| 5,818,380 | A | 10/1998 | Ito et al. |
| 5,835,045 | A | 11/1998 | Ogawa et al. |

(Continued)

FOREIGN PATENT DOCUMENTS

| | | |
|---|---|---|
| JP | 2000156472 A | 6/2000 |
| KR | 20160089141 A | 7/2016 |
| WO | 2019005175 A1 | 1/2019 |

OTHER PUBLICATIONS

"Kepler Logic", Named for Amalie Emmy Noether @ https://en.wikipedia.org/wiki/Emmy_Noether.

(Continued)

*Primary Examiner* — Anh Q Tran
(74) *Attorney, Agent, or Firm* — MUGHAL GAUDRY & FRANKLIN PC

(57) ABSTRACT

A low power adder uses a non-linear polar capacitor to retain charge with fewer transistors than traditional CMOS sequential circuits. The non-linear polar capacitor includes ferroelectric material, paraelectric material, or non-linear dielectric. The adder may include minority gates and/or majority gates. Input signals are received by respective terminals of capacitors having non-linear polar material. The other terminals of these capacitors are coupled to a node where the majority function takes place for the inputs.

17 Claims, 21 Drawing Sheets

(56) References Cited

U.S. PATENT DOCUMENTS

| | | | |
|---|---|---|---|
| 5,926,057 | A | 7/1999 | Ogawa et al. |
| 5,978,827 | A | 11/1999 | Ichikawa |
| 6,043,675 | A * | 3/2000 | Miyamoto ............ H03M 1/145 |
| | | | 326/11 |
| 6,198,652 | B1 | 3/2001 | Kawakubo et al. |
| 6,208,282 | B1 | 3/2001 | Miyamoto |
| 7,837,110 | B1 | 11/2010 | Hess et al. |
| 7,897,454 | B2 | 3/2011 | Wang et al. |
| 8,247,855 | B2 | 8/2012 | Summerfelt |
| 9,276,040 | B1 | 3/2016 | Marshall et al. |
| 9,324,405 | B2 | 4/2016 | Evans, Jr. et al. |
| 9,697,882 | B1 | 7/2017 | Evans, Jr. et al. |
| 9,858,979 | B1 | 1/2018 | Derner et al. |
| 9,912,323 | B1 | 3/2018 | Ardalan |
| 9,973,329 | B2 | 5/2018 | Hood et al. |
| 10,217,522 | B2 | 2/2019 | Wang et al. |
| 10,622,050 | B2 | 4/2020 | El-Mansouri et al. |
| 10,679,782 | B2 | 6/2020 | Manipatruni et al. |
| 10,944,404 | B1 * | 3/2021 | Manipatruni ............ G06F 7/501 |
| 11,165,430 | B1 | 11/2021 | Manipatruni et al. |
| 11,277,137 | B1 * | 3/2022 | Manipatruni .......... H03K 19/21 |
| 11,303,280 | B1 * | 4/2022 | Mathuriya .............. H01L 28/55 |
| 11,374,575 | B1 * | 6/2022 | Dokania ................ H01L 28/55 |
| 2001/0052619 | A1 | 12/2001 | Inoue et al. |
| 2002/0185690 | A1 | 12/2002 | Ueda et al. |
| 2004/0183508 | A1 | 9/2004 | Toyoda et al. |
| 2015/0337983 | A1 | 11/2015 | Dolenti et al. |
| 2017/0243917 | A1 | 8/2017 | Manipatruni et al. |
| 2017/0337983 | A1 | 11/2017 | Wang et al. |
| 2018/0076815 | A1 | 3/2018 | Vigeant et al. |
| 2018/0240583 | A1 | 8/2018 | Manipatruni et al. |
| 2019/0074295 | A1 | 3/2019 | Schröder |
| 2019/0318775 | A1 | 10/2019 | Rakshit et al. |
| 2019/0348098 | A1 | 11/2019 | El-Mansouri et al. |
| 2020/0091407 | A1 | 3/2020 | Liu et al. |
| 2020/0091414 | A1 * | 3/2020 | Liu ........................ H10N 50/85 |
| 2020/0210233 | A1 | 7/2020 | Chen et al. |

OTHER PUBLICATIONS

Fichtner, S. et al., "AlScN: A III-V semiconductor based ferroelectric", Journal of Applied Physics 125, 114103 (2019); https://doi.org/10.1063/1.5084945, 2019, 28 pages.

Final Office Action notified Jul. 6, 2020 for U.S. Appl. No. 16/729,269.

Final Office Action notified Nov. 24, 2020 for U.S. Appl. No. 16/797,299.

Final Office Action notified Nov. 27, 2020 for U.S. Appl. No. 16/729,275.

First Office Action & Search Report notified Jun. 25, 2021 for Taiwan Patent Application No. 109146064.

First Office Action notified Jul. 7, 2021 for Taiwan Patent Application No. 109146061.

International Search Report & Written Opinion notified Apr. 15, 2021 for U.S. Patent Application No. PCT/US2020/066961.

International Search Report & Written Opinion notified Apr. 22, 2021 for PCT Patent Application No. PCT/US2020/066963.

Muller, J. et al., "Ferroelectric Hafnium Oxide Based Materials and Devices: Assessment of Current Status and Future Prospects", ECS Journal of Solid State Science and Technology, 4 (5) N30-N35 (215). 6 pages.

Muroga, S., "Threshold Logic and its Applications", New York, Wiley-Interscience. published 1971.

Non-Final Office Action notified Apr. 22, 2020 for U.S. Appl. No. 16/729,275.

Non-Final Office Action notified Aug. 7, 2020 for U.S. Appl. No. 16/729,275.

Non-Final Office Action notified Aug. 11, 2020 for U.S. Appl. No. 16/796,824.

Non-Final Office Action notified Aug. 13, 2020 for U.S. Appl. No. 16/797,299.

Non-Final Office Action notified Mar. 27, 2020 for U.S. Appl. No. 16/729,269.

Non-Final Office Action notified Nov. 24, 2020 for U.S. Appl. No. 16/796,824.

Non-Final Office Action notified Sep. 16, 2021 for U.S. Appl. No. 17/129,824.

Notice of Allowance notified Feb. 3, 2021 for U.S. Appl. No. 16/729,275.

Notice of Allowance notified Feb. 5, 2020 for U.S. Appl. No. 16/796,824.

Notice of Allowance notified Jan. 29, 2020 for U.S. Appl. No. 16/797,299.

Notice of Allowance notified Nov. 3, 2020 for U.S. Appl. No. 16/797,296.

Notice of Allowance notified Oct. 1, 2021 for Taiwan Patent Application No. 109146061.

Notice of Allowance notified Sep. 21, 2020 for U.S. Appl. No. 16/729,269.

Subbarao, E., "Ferroelectric and antiferroelectric materials", Department of Metallurgical Engineering, Indian Institute of Technology, Kanpur, IN. First published Mar. 15, 2011. Ferroelectrics, 5:1, 267-280.

Final Office Action notified Dec. 15, 2021 for U.S. Appl. No. 17/129,824.

Final Office Action notified Nov. 26, 2021 for U.S. Appl. No. 17/129,800.

Non-Final Office Action notified Nov. 3, 2021 for U.S. Appl. No. 17/129,800.

Notice of Allowance notified Dec. 3, 2021 for U.S. Appl. No. 17/129,830.

Notice of Allowance notified Dec. 21, 2021 for U.S. Appl. No. 17/129,800.

Notice of Allowance notified Oct. 28, 2021 for Taiwan Patent Application No. 109146064.

Final Office Action notified Apr. 4, 2022 for U.S. Appl. No. 17/129,849.

Non-Final Office Action notified Feb. 22, 2022 for U.S. Appl. No. 17/129,849.

Notice of Allowance notified Apr. 14, 2022 for U.S. Appl. No. 17/129,849.

Notice of Allowance notified Mar. 2, 2022 for U.S. Appl. No. 17/129,821.

* cited by examiner

FERROELECTRIC OR PARAELECTRIC WIDE-INPUT MINORITY OR MAJORITY GATE BASED LOW POWER ADDER

CLAIM OF PRIORITY

This application is a continuation of, and claims priority to, U.S. patent application Ser. No. 17/465,781, filed Sep. 2, 2021, titled "FERROELECTRIC OR PARAELECTRIC BASED LOW POWER ADDER," which is incorporated by reference in its entirety.

BACKGROUND

Typical 1-bit full adder receives three or more inputs and may consist of several logic gates such as AND gate, OR, gate, XOR gates, inverters, and buffers. In complementary metal oxide semiconductor (CMOS) logic, a 2-input AND gate derived from a 2-input NAND gate and an inverter consists of six transistors. A 2-input OR gate derived from a 2-input NOR gate and an inverter consists of six transistors. A 2-input XOR gate may consist of at least six transistors. As the number of transistors increases, power consumption and area also increase. As devices are pushing down the power envelope to save battery power, existing circuit architecture for 1-bit full adder presents challenges to the goal of lower power consumption.

The background description provided here is for the purpose of generally presenting the context of the disclosure. Unless otherwise indicated here, the material described in this section is not prior art to the claims in this application and are not admitted being prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
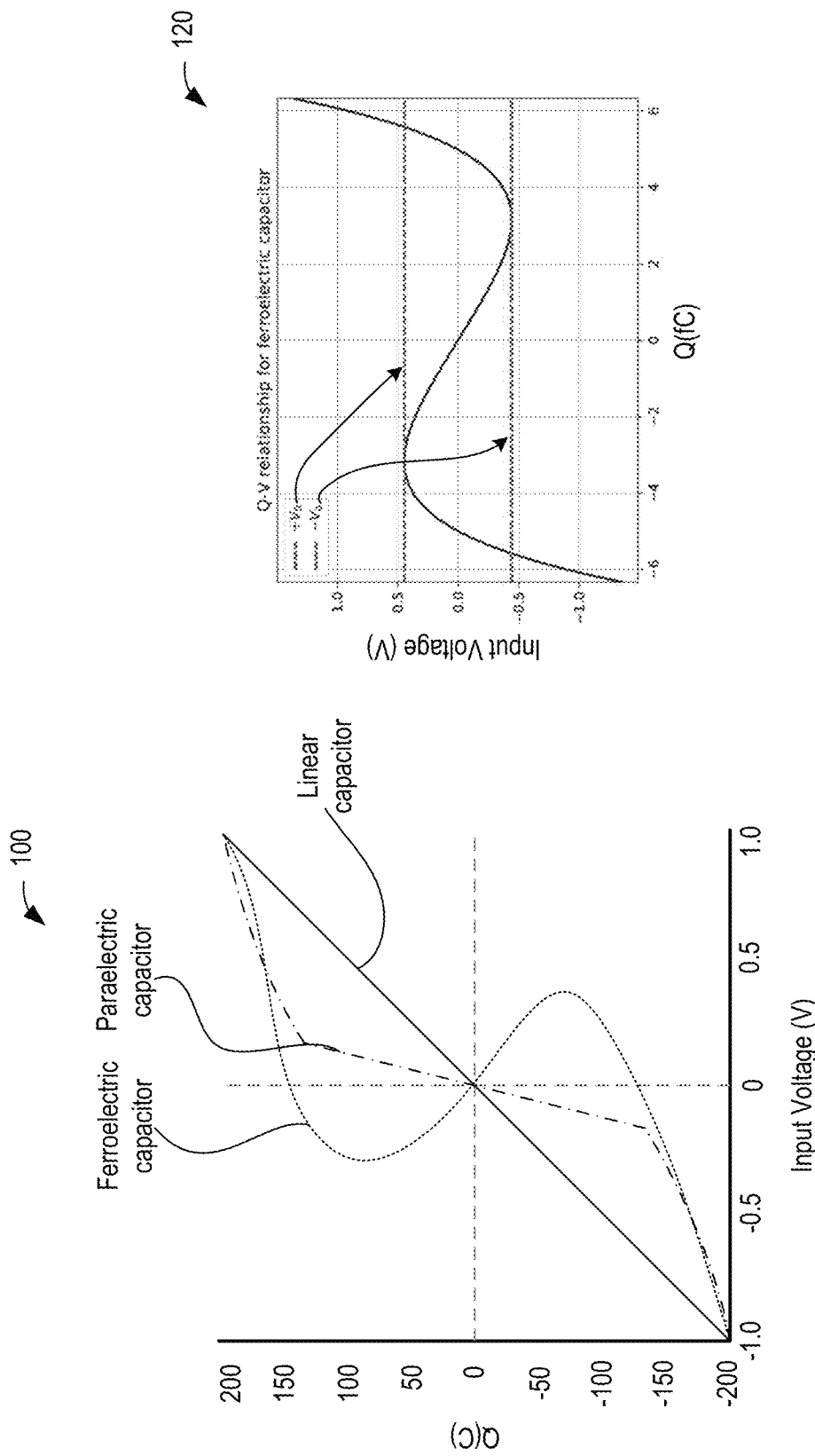
FIG. 1 illustrates a set of plots showing behavior of a ferroelectric capacitor, a paraelectric capacitor, and a linear capacitor.

In various embodiments, an adder is derived from two or more minority or majority gates with non-linear polar material. A full adder adds binary numbers. A one-bit full-adder adds three one-bit numbers, A, B, and $C_{in}$, where A and B are the operands, and $C_{in}$ is a carry-in bit which is carried in from a previous, less-significant stage. A full adder is usually derived as a cascade of adders. These adders add, for example, 8, 16, 32, etc. bit binary numbers. The output of a 1-bit full adder circuit produces a 2-bit output. One of the output bits is a carry output and other output bit is a sum. The carry is typically represented by signal Cout while the sum is typically represented by signal S, where the sum equals $2C_{out}+S$. Implementing a 1-bit adder requires many logic gates such as AND logic gate, OR logic gate, inverters, and sometime state elements such as flip-flops.

Some embodiments describe a new class of logic gates that use non-linear polar material. This new class of logic gates becomes the basis of a 1-bit full-adder. The logic gates include multi-input minority gates, majority gates, and threshold gates. Input signals are received by respective terminals of capacitors having the non-linear polar material. The other terminals of these capacitors are coupled to a node where the majority function takes place for the inputs. The output from the majority function can then be directly used in a subsequent logic (e.g., another majority, minority, or threshold gate) or a driver circuitry. The driver circuitry can be any suitable logic gate such as a buffer, inverter, multiplexer, NAND gate, NOR gate, etc. As such, the majority gate, the minority gate, or the threshold gate of various embodiments can be combined with existing transistor technologies such as complementary metal oxide semiconductor (CMOS), tunneling field effect transistor (TFET), GaAs based transistors, bipolar junction transistors (BJTs), Bi-CMOS transistors, etc.

In some embodiments, the 1-bit full adder comprises a first 3-input minority gate that receives a first input (e.g., A), a second input (e.g., B), and an inverted version of a third input (e.g., Cinb), wherein the first input is a first operand, wherein the second input is a second operand, and wherein the third input is a carry-in bit. In various embodiments, the first 3-input minority gate generates a first output which is a first minority function of the first input, the second input, and the inverted version of the third input. In some embodiments, the 1-bit full adder comprises a second 3-input minority gate that receives the first input, the second input, and the third input. In various embodiments, the second 3-input minority gate generates a second output which is a second minority function of the first input, the second input, and the third input. In some embodiments, the 1-bit full adder comprises a third 3-input minority gate that receives the first output, an inverted version of the second output, and the third input. In some embodiments, the third 3-input minority gate generates a third output which is a third minority function of the first output, the inverted version of the second output, and the third input. In some embodiments, the second output is a carry-out, and wherein the third output is a sum. In some embodiments, the first 3-input minority gate, the second 3-input minority gate, and the third 3-input minority gate include non-linear polar material. In some embodiments, the non-linear polar material includes one of: ferroelectric material, paraelectric material, or non-linear dielectric.

In some embodiments, the first 3-input minority gate comprises a first capacitor that receives the first input, wherein the first capacitor is coupled to a node. In some embodiments, the second 3-input minority gate comprises a second capacitor that receives the second input, wherein the second capacitor is coupled to the node. In some embodiments, the second 3-input minority gate comprises a third capacitor that receives the inverted version of the third input, wherein the third capacitor is coupled to the node. In various embodiments, the first capacitor, the second capacitor, and the third capacitor include the non-linear polar material. In some embodiments, the first 3-input minority gate comprises a driver circuitry having a capacitive input coupled to the node, and an output which provides a majority or minority logic function of the first input, the second input, the inverted version of the third input. Other minority gates here have similar input capacitors with non-linear polar material.

There are many technical effects of the various embodiments. For example, extremely compact adder circuitry is formed using the design of various embodiments. The non-linear polar material used in the adder can be a ferroelectric material, a paraelectric material, or a non-linear dielectric. The majority gate, minority gate, and/or threshold gate of various embodiments lowers the power consumption of the adder circuit because the majority, minority gate, and/or threshold gate do not use switching transistors and the interconnect routings are much fewer than the interconnect routings used in transitional CMOS logic gates. For example, 10× fewer interconnect length is used by the majority gate and threshold gate of various embodiments than traditional CMOS circuits for the same function and performance. The capacitor with non-linear polar material provides non-volatility that allows for intermittent operation and zero power drain when not in use.

For example, a processor having such adder circuits can enter and exit various types of low power states without having to worry about losing data. Since the capacitor with non-linear polar material can store charge from low energy devices, the entire processor can operate at much lower voltage level from the power supply, which reduces overall power of the processor. Further, very low voltage switching (e.g., 100 mV) of the non-linear polar material state allows for low swing signal switching, which in turn results in low power.

The capacitor with non-linear polar material can be used with any type of transistor. For example, the capacitor with non-linear polar material of various embodiments can be used with planar or non-planar transistors. The transistors can be formed in the frontend or backend of a die. The capacitors with non-linear polar material can be formed in the frontend or backend of the die. As such, the logic gates can be packed with high density compared to traditional logic gates. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

It is pointed out that those elements of the figures having the same reference numbers (or names) as the elements of any other figure can operate or function in any manner like that described but are not limited to such.

FIG. 1 illustrates set of plots 100 and 120 showing behavior of a ferroelectric capacitor, a paraelectric capacitor, and a linear capacitor. Plot 100 compares the transfer function f or a linear capacitor, a paraelectric (PE) capacitor (a non-linear capacitor) and a ferroelectric (FE) capacitor (a non-linear capacitor). Here, x-axis is input voltage or voltage across the capacitor, while the y-axis is the charge on the capacitor. The ferroelectric material can be any suitable low voltage FE material that allows the FE material to switch its state by a low voltage (e.g., 100 mV). Threshold in the FE material has a highly non-linear transfer function in the polarization vs. voltage response. The threshold is related to: a) non-linearity of switching transfer function; and b) the squareness of the FE switching. The non-linearity of switching transfer function is the width of the derivative of the polarization vs. voltage plot. The squareness is defined by the ratio of the remnant polarization to the saturation polarization; perfect squareness will show a value of 1. The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of an FE layer. A perfectly epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

Plot 120 shows the charge and voltage relationship for a ferroelectric capacitor. A capacitor with ferroelectric material (also referred to as a FEC) is a non-linear capacitor with its potential $V_F(Q_F)$ as a cubic function of its charge. Plot 120 illustrates characteristics of an FEC. Plot 120 is a charge-voltage (Q-V) plot for a block of $Pb(Zr_{0.5}Ti_{0.5})O_3$ of area $(100\ nm)^2$ and thickness 20 nm (nanometer). Plot 120 shows local extrema at $+/-V_o$ indicated by the dashed lines. Here, the term $V_c$ is the coercive voltage. In applying a potential V across the FEC, its charge can be unambiguously determined only for $|V|>V_o$. Otherwise, the charge of the FEC is subject to hysteresis effects.

Figure 2:
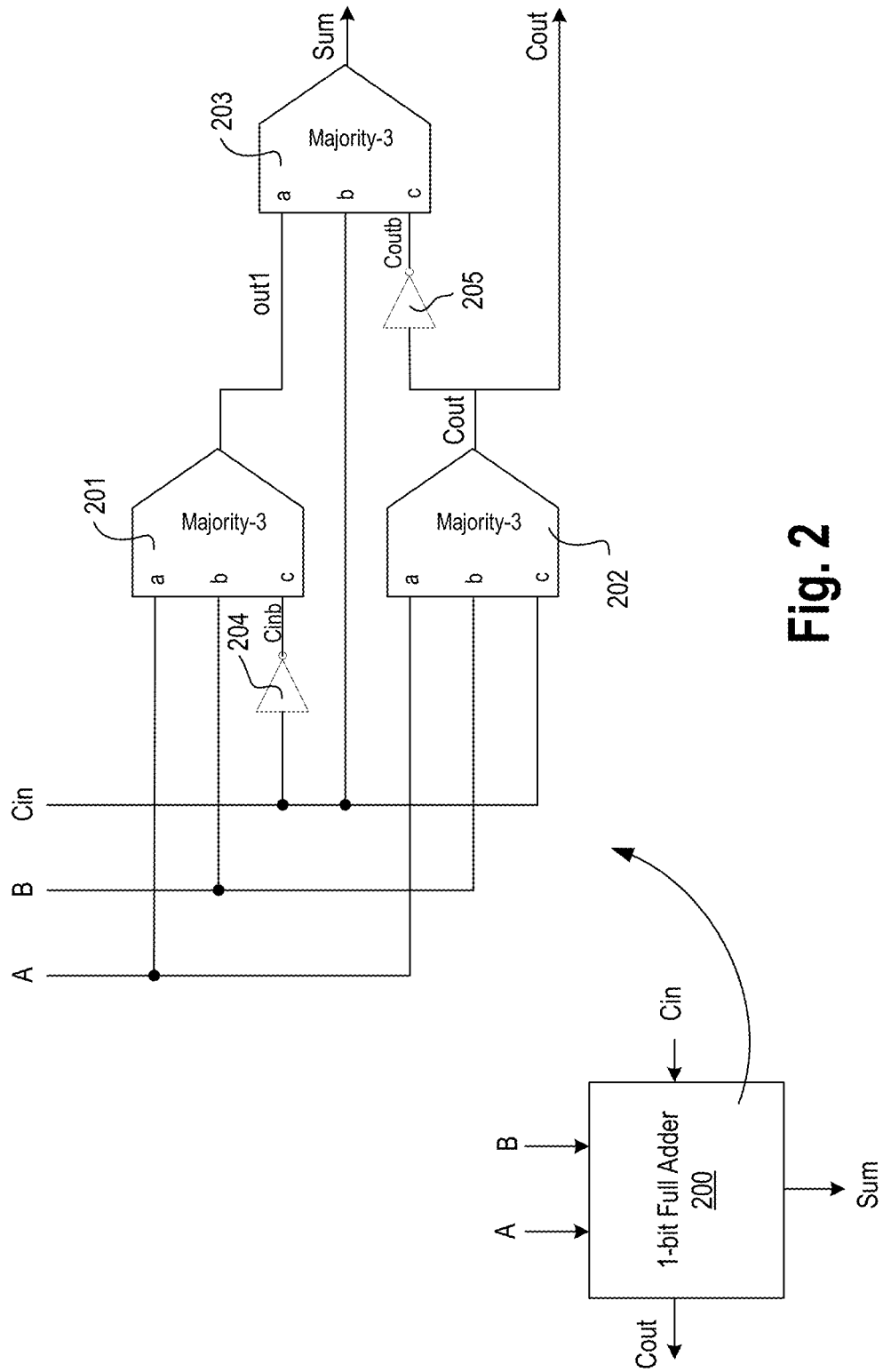
FIG. 2 illustrates a 1-bit adder having a 3-input majority gate with ferroelectric or paraelectric material, in accordance with some embodiments.

FIG. 2 illustrates 1-bit 3-input majority gate-based adder 200 with ferroelectric or paraelectric material, in accordance with some embodiments. In some embodiments, 1-bit full adder 200 comprises a first 3-input majority gate 201, a second 3-input majority gate 202, a third 3-input majority gate 203, a first inverter 204, and a second inverter 205. Each majority gate here has three inputs 'a', 'b', and 'c', which are coupled to various nodes as shown. In various embodiments, first 3-input majority gate 201 receives a first input (e.g., A), a second input (e.g., B), and an inverted version of a third input (e.g., Cinb), wherein the first input is a first operand, wherein the second input is a second operand, and wherein the third input is a carry-in bit. In various embodiments, the inverted version of a third input is generated by inverter 204. In some embodiments, inverter 204 can be replaced with any suitable inverting logic such as NAND gate, NOR gate, etc.

In various embodiments, first 3-input majority gate 201 generates a first output out1 which is a first majority function of the first input, the second input, and the inverted version of the third input. In some embodiments, second 3-input majority gate 202 receives the first input, the second input, and the third input. In various embodiments, second 3-input majority gate 202 generates second output Cout which is a second majority function of the first input, the second input, and the third input. In some embodiments, third 3-input majority gate 203 receives the first output, an inverted version of the second output, and the third input. In some embodiments, third 3-input majority gate 203 generates third output Sum which is a third majority function of the first output, the inverted version of the second output (Coutb), and the third input. In various embodiments, the second output Cout is a carry-out, while the third output is a sum of the operands. In some embodiments, first 3-input majority gate 201, second 3-input majority gate 202, and third 3-input majority gate 203 include non-linear polar material. In some embodiments, the non-linear polar material includes one of: ferroelectric material, paraelectric material, or non-linear dielectric.

In some embodiments, first 3-input majority gate 201 comprises a first capacitor that receives the first input, wherein the first capacitor is coupled to a node. In some embodiments, first 3-input majority gate 201 comprises a second capacitor that receives the second input, wherein the second capacitor is coupled to the node. In some embodiments, first 3-input majority gate 201 comprises a third capacitor that receives the inverted version of the third input, wherein the third capacitor is coupled to the node. In various embodiments, the first capacitor, the second capacitor, and the third capacitor include the non-linear polar material. In some embodiments, a buffer is added on the node to drive the majority function output. Other majority gates 202 and 203 have similar input capacitors with non-linear polar material.

1-bit adder 200 has three inputs, and it spits out carry Cout and sum as the outputs. In various embodiments, 1-bit adder 200 can be built with minimum of three gates using 3-input majority gates (or 3-input minority gates). In various embodiments, the carry output Cout of full adder 200 directly maps to the majority operation of its three inputs. In some embodiments, the sum operation is an XOR operation of its three inputs. The XOR is a non-linear function and uses at least a depth of 2 to build it. Carry output Cout is inverted by inverter 205 and can be utilized for getting the final sum output using another majority gate 203. 1-bit full adder cell 200 can also be used as half-adder cell, where one of the inputs is set to zero. In some embodiments, 1-bit full adder cell 200 is a fundamental building block of multiplier and adder circuits, and wherever an addition operation can be utilized.

Figure 3A:
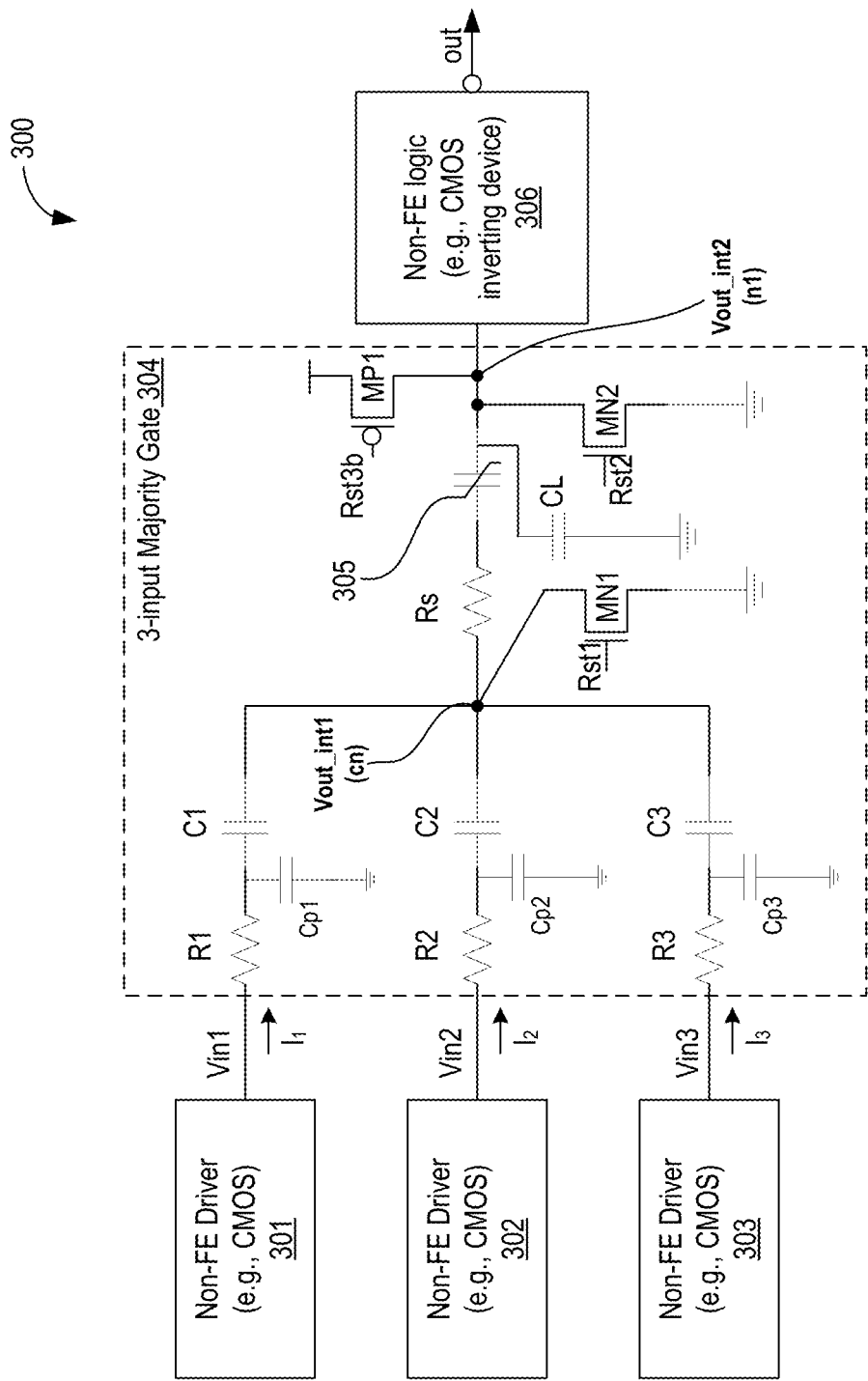
FIG. 3A illustrates a 3-input majority or minority gate with linear input capacitors and non-linear output capacitors, in accordance with some embodiments.

FIG. 3A illustrates 3-input majority or minority gate 300 with linear input capacitors and non-linear output capacitors, in accordance with some embodiments. Logic gate 300 comprises first, second, and third drivers 301, 302, and 303, respectively. These drivers can be analog drivers generating analog signals or digital drivers generating signals that toggle between ground and the power supply rail, or a combination of analog or digital drivers. For example, driver 301 is a CMOS driver such as a buffer, inverter, a NAND gate, a NOR gate, etc., while driver 302 is an amplifier generating a bias signal. The drivers provide input signals Vin1 (and current $I_1$), Vin2 (and current $I_2$), and Vin3 (and current $I_3$) to the three inputs of 3-input majority gate 304.

In various embodiments, 3-input majority gate 304 comprises three input nodes Vin1, Vin2, and Vin3. Here, signal names and node names are interchangeably used. For example, Vin1 refers to node Vin1 or signal Vin1 depending on the context of the sentence. 3-input majority gate 303 further comprises capacitors C1, C2, and C3. Here, resistors R1, R2, and R3 are interconnect parasitic resistances coupled to capacitors C1, C2, and C3 respectively. In various embodiments, capacitors C1, C2, and C3 are non-ferroelectric capacitors. In some embodiments, the non-ferroelectric capacitor includes one of: dielectric capacitor, paraelectric capacitor, or non-linear dielectric capacitor.

A dielectric capacitor comprises first and second metal plates with a dielectric between them. Examples of such dielectrics are: HfO, ABO3 perovskites, nitrides, oxy-fluorides, oxides, etc.

A paraelectric capacitor comprises first and second metal plates with a para-electric material between them. In some embodiments, f-orbital materials (e.g., lanthanides) are doped to the ferroelectric materials to make paraelectric material. Examples of room temperature paraelectric material include: SrTiO3, Ba(x)Sr(y)TiO3 (where x is −0.5, and y is 0.95)), HfZrO2, Hf—Si—O, La-substituted PbTiO3, PMN-PT based relaxor ferroelectrics.

A dielectric capacitor comprises first and second metal plates with non-linear dielectric capacitor between them. The range for dielectric constant is 1.2 to 10000. The capacitors C1, C2, and C3 can be implemented as MIM (metal-insulator-metal) capacitor technology, transistor gate capacitor, hybrid of metal capacitors or transistor capacitor.

The capacitors C1, C2, and C3 can be implemented as MIM (metal-insulator-metal) capacitor technology, transistor gate capacitor, or hybrid of metal capacitors or transistor capacitor.

One terminal of the capacitors C1, C2, and C3 is coupled to a common node cn. This common node is coupled to node n1, which is coupled to a first terminal of a non-linear polar capacitor 305. The majority function is performed at the common node cn, and the resulting voltage is projected on to capacitor 305. For example, the majority function of the currents ($I_1$, $I_2$, and $I_3$) on node cn results in a resultant current that charges capacitor 305. Table 1 illustrates the majority function $f$(Majority Vin1, Vin2, Vin3).

TABLE 1

| Vin1 | Vin2 | Vin3 | cn (f(Majority Vin1, Vin2, Vin3)) |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

Referring to FIG. 3A, in some embodiments, N odd number of capacitors are coupled to a single FEC to form a majority gate. In this case, N=3. The measured charge on the FEC ($Q_F$) is the output of the majority gate. Solving for a steady-state solution, the parasitic resistors are ignored and the input potentials $V_i$ (or Vin) are assumed to be constant. In this case, the charge across each linear capacitor (C1, C2, C3) is:

$$Q_i = C_i(V_i - V_F) \quad (1)$$

The charge summed at node Cn and across FEC 305 is express as:

$$Q_F = \Sigma_i Q_i \quad (2)$$

$$Q_F \Sigma_i C_i V_i - \Sigma_i C_i V_i \quad (3)$$

$$Q_F = \Sigma_i C_i V_i - C V_F(Q_F) \quad (4)$$

$$V_F(Q_F) = \sum_i \frac{C_i}{C} V_i - \frac{Q_F}{C} \quad (5)$$

Here, $C = \Sigma_i C_i$ is the sum of the capacitances. In the limit, $C \to \infty$, the following is achieved:

$$V_F(Q_F) = \sum_i \frac{C_i}{C} V_i = \bar{V} \quad (6)$$

The potential across FEC 305 is the average of all the input potentials weighted by the capacitances (e.g., C1, C2, and C3).

When $C_i = C/N$ are all equal, $V_F$ is just a simple mean. To ensure that $$Q_F = V_F^{-1}(\bar{V}) \quad (7)$$

is well defined, all possible values of $\bar{V}$ have magnitudes greater than $V_c$, the coercive potential. Assuming binary input of $+/-V_s$, the potential with the smallest magnitude is:

$$\bar{V} = V_s/N \quad (8)$$

This occurs when (N+1)/2 of the inputs are $+V_s$ and (N−1)/2 are $-V_s$. Then, $$V_s > NV_c \quad (9)$$

As an example, for N=3, the possible inputs are:

$$\bar{V} \in \left\{ -\frac{3}{3}V_s, -\frac{1}{3}V_s, +\frac{1}{3}V_s, +\frac{3}{3}V_s \right\} \quad (10)$$

Referring to FIG. 3A, since capacitor 305 is a non-linear polar capacitor, both terminals of the capacitor are pre-discharged to ground or to a known predetermined voltage via n-type transistors pull-down transistors MN1 and MN2, and p-type pull-up transistors. The predetermined voltage can be programmable. The pre-determined voltage can be positive or negative. In some embodiments, n-type transistor MN1 is coupled to node Vout_int1 (internal Vout node) and is controllable by clock or reset signal Rst1. In some embodiments, n-type transistor MN2 is coupled to node Vout_int2 (internal Vout node) and is controllable by clock or reset signal Rst2. In some embodiments, p-type transistor MP1 is coupled to node Vout_int2 and is controllable by Rst3b.

In some embodiments, the n-type transistors MN1 and MN2 are replaced with p-type transistors to pre-charge both terminals (Vout_int1 and Vout_int2) of capacitor 305 to a supply voltage or another predetermined voltage, while the p-type transistor MP1 is replaced with an n-type transistor coupled to ground or a negative supply rail. The predetermined voltage can be programmable. The pre-determined voltage can be positive or negative.

In some embodiments, the pre-charge or pre-discharge of the terminals of capacitor 305 (or nodes cn and n1) is done periodically by a control signals Rst1, Rst2, and Rst3b. The controls can be a non-clock signal that is generated by a control logic (not shown). For example, the control can be issued every predetermined or programmable time. In some embodiments, control signals Rst1, Rst2, and Rst3b are issued in a reset phase, which is followed by an evaluation phase where inputs Vin1, Vin2, and Vin3 are received, and majority function is performed on them.

Rst1 has a pulse larger than the pulse widths of Rst2 and Rst3b. Rst3b is an inverse of Clk3 (not shown). In some embodiments, Rst1 is first asserted which begins to discharge node Vout_int1. While node Vout_int1 is being discharged, Rst2 is asserted. Rst2 may have a pulse width which is substantially half of the pulse width of Rst1. When Rst2 is asserted, node Vout_int2 is discharged. This sequence assures that both terminals of the non-linear polar material of capacitor 305 are discharged sequentially. In various embodiments, before discharging node Vout_int2, Rst3b is de-asserted which turns on transistor MP1, causing Vout_int2 to be charged to a predetermined value (e.g., supply level). The pulse width of Rst3b is smaller than the pulse width of Rst1 to ensure the Rst3b pulsing happens within the Rst1 pulse window. This is useful to ensure non-linear polar capacitor 305 is initialized to a known programmed state along with the other capacitors (e.g., C1, C2, C3) which are initialized to 0 V across them. The pulsing on Vout_int2 creates the correct field across the non-linear polar capacitor 305 in conjunction with Vout_int1 to put it in the correct state, such that during operating mode, if Vout_int1 goes higher than Vc value (coercive voltage value), it triggers the switching for non-linear polar capacitor 305, thereby resulting into a voltage build-up on Vout_int2.

In some embodiments, load capacitor CL is added to node Vout_int2. In some embodiments, load capacitor CL is a regular capacitor (e.g., a non-ferroelectric capacitor). The capacitance value of CL on Vout_int2 is useful to ensure that the FE switching charge (of FE capacitor 305) provides the right voltage level. For a given FE size (area A), with polarization switching density (dP) and desired voltage swing of Vdd (supply voltage), the capacitance of CL should be approximately CL=dP*A/Vdd. There is slight deviation from the above CL value as there is charge sharing on Vout_int2 due to dielectric component of FE capacitor 305. The charge sharing responds relative to voltage on Vout_int1, and capacitor divider ratio between the dielectric component of the FE capacitor 305, and load capacitor (CL). Note, the capacitance of CL can be aggregate of all the capacitances (e.g., parasitic routing capacitance on the node, gate capacitance of the output stage 306, and drain or source capacitance of the reset devices (e.g., MN2, MP1) on the Vout_int2 node. In some embodiments, for a given size of non-linear polar capacitor 305, CL requirement can be met by just the load capacitance of non-FE logic 306, and parasitic component itself, and may not need to have it as a separate linear capacitor.

In some embodiments, the non-linear polar material of capacitor 305 includes one of: ferroelectric (FE) material, paraelectric material, relaxor ferroelectric, or non-linear dielectric. In various embodiments, para-electric material is the same as FE material but with chemical doping of the active ferroelectric ion by an ion with no polar distortion. In some cases, the non-polar ions are non-s orbital ions formed with p, d, f external orbitals. In some embodiments, non-linear dielectric materials are same as para-electric materials, relaxors, and dipolar glasses.

In some embodiments, f-orbital materials (e.g., lanthanides) are doped to the ferroelectric material to make paraelectric material. Examples of room temperature paraelectric material include: SrTiO3, Ba(x)Sr(y)TiO3 (where x is −0.5, and y is 0.95), HfZrO2, Hf—Si—O, La-substituted PbTiO3, PMN-PT based relaxor ferroelectrics.

In various embodiments, the FE material can be any suitable low voltage FE material that allows the FE material to switch its state by a low voltage (e.g., 100 mV). In some embodiments, the FE material comprises a perovskite of the type $ABO_3$, where 'A' and 'B' are two cations of different sizes, and 'O' is oxygen which is an anion that bonds to both the cations. Generally, the size of A atoms is larger than the size of B atoms. In some embodiments, the perovskite can be doped (e.g., by La or lanthanides). Perovskites can be suitably doped to achieve a spontaneous distortion in a range of 0.3 to 2%. For example, for chemically substituted lead titanate such as Zr in Ti site; La or Nb in Ti site, the concentration of these substitutes is such that it achieves the spontaneous distortion in the range of 0.3 to 2%. For chemically substituted BiFeO3, BiCrO3, BiCoO3 class of materials, La or rare earth substitution into the Bi site can tune the spontaneous distortion.

Threshold in the FE material has a highly non-linear transfer function in the polarization vs. voltage response. The threshold is related to: a) non-linearity of switching transfer function; and b) the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of the FE layer. A perfect epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In some embodiments, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, LaNiO3, and ReO3.

In some embodiments, the FE material comprises a stack of layers including low voltage FE material between (or sandwiched between) conductive oxides. In various embodiments, when FE material is a perovskite, the conductive oxides are of the type $AA'BB'O_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, and Zn. A' may have the same valency of site A, with a different ferroelectric polarizability.

In some embodiments, the FE material comprises hexagonal ferroelectrics of the type h-RMnO3, where R is a rare earth element such as: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides adjacent to the FE material are of A2O3 (e.g., In2O3, Fe2O3) and AB2O3 type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 to 100. While various embodiments here are described with reference to ferroelectric material for storing the charge state, the embodiments are also applicable for paraelectric material. For example, the capacitor of various embodiments can be formed using paraelectric material instead of ferroelectric material.

In some embodiments, the FE material includes one of: hafnium (Hf), zirconium (Zr), aluminum (Al), silicon (Si), their oxides, or their alloyed oxides. In some embodiments, the FE material includes one of: Al(1-x)Sc(x)N, Ga(1-x)Sc(x)N, Al(1-x)Y(x)N or Al(1-x-y)Mg(x)Nb(y)N, y doped HfO2, where y includes one of: Al, Ca, Ce, Dy, Er, Gd, Ge, La, Sc, Si, Sr, Sn, or Y, wherein 'x' is a fraction. In some embodiments, the FE material includes bismuth ferrite or BFO, lead zirconate titanate (PZT), BFO with a first doping material, or PZT with a second doping material, wherein the doping material is one of Nb or relaxor ferroelectrics such as PMN-PT.

In some embodiments, the FE material includes bismuth ferrite (BFO) or BFO with a first doping material wherein the first doping material is one of lanthanum, or any element from the lanthanide series of the periodic table. In some embodiments, the FE material includes lead zirconium titanate (PZT) or PZT with a second doping material, wherein the doping material is one of La or Nb. In some embodiments, the FE material includes a relaxor ferroelectric which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST).

In some embodiments, the FE material includes hafnium oxides of the form, Hf(1-x)ExOy where E can be Al, Ca, Ce, Dy, Er, Gd, Ge, La, Sc, Si, Sr, Sn, or Y. In some embodiments, the FE material includes niobate type compounds LiNbO3, LiTaO3, lithium iron tantalum oxy fluoride, barium strontium niobate, sodium barium niobate, or potassium strontium niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are n octahedral layers in thickness can be used.

In some embodiments, the FE material comprises organic material. For example, polyvinylidene fluoride or polyvinylidene difluoride (PVDF).

The FE material is between two electrodes. These electrodes are conducting electrodes. In some embodiments, the electrodes are perovskite templated conductors. In such a templated structure, a thin layer (e.g., approximately 10 nm) of a perovskite conductor (such as SrRuO3) is coated on top of IrO2, RuO2, PdO2, or PtO2 (which have a non-perovskite structure but higher conductivity) to provide a seed or template for the growth of pure perovskite ferroelectric at low temperatures. In some embodiments, when the ferroelectric comprises hexagonal ferroelectric material, the electrodes can have hexagonal metals, spinels, or cubic metals. Examples of hexagonal metals include: PtCoO2, PdCoO2, and other delafossite structured hexagonal metallic oxides such as Al-doped ZnO. Examples of spinels include Fe3O4 and LiV2O4. Examples of cubic metals include indium tin oxide (ITO) such as Sn-doped In2O3.

The charge developed on node n1 produces a voltage and current that is the output of the majority gate 304. Any suitable driver 306 can drive this output. For example, a non-FE logic, FE logic, CMOS logic, BJT logic, etc. can be used to drive the output to a downstream logic. Examples of the drivers include inverters, buffers, NAND gates, NOR gates, XOR gates, amplifiers, comparators, digital-to-analog converters, analog-to-digital converters, etc. In some embodiments, output "out" is reset by driver 306 via Rst1 signal. For example, NAND gate with one input coupled to Vout_int2 and the other input coupled to Rst1 can be used to reset "out" during a reset phase.

While FIG. 3A illustrates a 3-input majority gate, the same concept can be extended to more than 3 inputs to make an N-input majority gate, where N is greater than 2. For example, a 5-input majority gate is like 3-input majority gate 304 but for additional inputs Vin4 and Vin5. These inputs can come from the same drivers (e.g., any one of drivers 301, 302, 303) or from different drivers. Input Vin4 and Vin5 can be analog, digital, or a combination of them. For example, Vin4 is a digital signal while Vin5 is an analog signal. The additional inputs Vin4 and Vin5 are coupled to additional non-ferroelectric capacitors C4 and C5, respectively (not shown). The composition and size of the capacitors C4 and C5 are like that of C1, C2, and C3. Here, resistors R4 and R5 are parasitic resistors.

The majority function is performed at the common node cn, and the resulting voltage is projected on to capacitor 305. For example, the majority function of the currents ($I_1$, $I_2$, $I_3$, $I_4$, and $I_5$) on node cn results in a resultant current that charges capacitor 305. Table 2 illustrates the majority function f(Majority Vin1, Vin2, Vin3, Vin4, Vin5) of a 5-input majority gate.

TABLE 2

| Vin1 | Vin2 | Vin3 | Vin4 | Vin5 | cn (f(Majority Vin1, Vin2, Vin3, Vin4, Vin5)) |
|---|---|---|---|---|---|
| 0 | 0 | 0 | 0 | 0 | 0 |
| 0 | 0 | 0 | 0 | 1 | 0 |
| 0 | 0 | 0 | 1 | 0 | 0 |
| 0 | 0 | 0 | 1 | 1 | 0 |
| 0 | 0 | 1 | 0 | 0 | 0 |
| 0 | 0 | 1 | 0 | 1 | 0 |
| 0 | 0 | 1 | 1 | 0 | 0 |
| 0 | 0 | 1 | 1 | 1 | 1 |
| 0 | 1 | 0 | 0 | 0 | 0 |
| 0 | 1 | 0 | 0 | 1 | 0 |
| 0 | 1 | 0 | 1 | 0 | 0 |
| 0 | 1 | 0 | 1 | 1 | 1 |
| 0 | 1 | 1 | 0 | 0 | 0 |
| 0 | 1 | 1 | 0 | 1 | 1 |
| 0 | 1 | 1 | 1 | 0 | 1 |
| 0 | 1 | 1 | 1 | 1 | 1 |
| 1 | 0 | 0 | 0 | 0 | 0 |
| 1 | 0 | 0 | 0 | 1 | 0 |
| 1 | 0 | 0 | 1 | 0 | 0 |
| 1 | 0 | 0 | 1 | 1 | 1 |
| 1 | 0 | 1 | 0 | 0 | 0 |
| 1 | 0 | 1 | 0 | 1 | 1 |
| 1 | 0 | 1 | 1 | 0 | 1 |
| 1 | 0 | 1 | 1 | 1 | 1 |
| 1 | 1 | 0 | 0 | 0 | 0 |
| 1 | 1 | 0 | 0 | 1 | 1 |
| 1 | 1 | 0 | 1 | 0 | 1 |
| 1 | 1 | 0 | 1 | 1 | 1 |
| 1 | 1 | 1 | 0 | 0 | 1 |
| 1 | 1 | 1 | 0 | 1 | 1 |
| 1 | 1 | 1 | 1 | 0 | 1 |
| 1 | 1 | 1 | 1 | 0 | 1 |

Figure 3B:
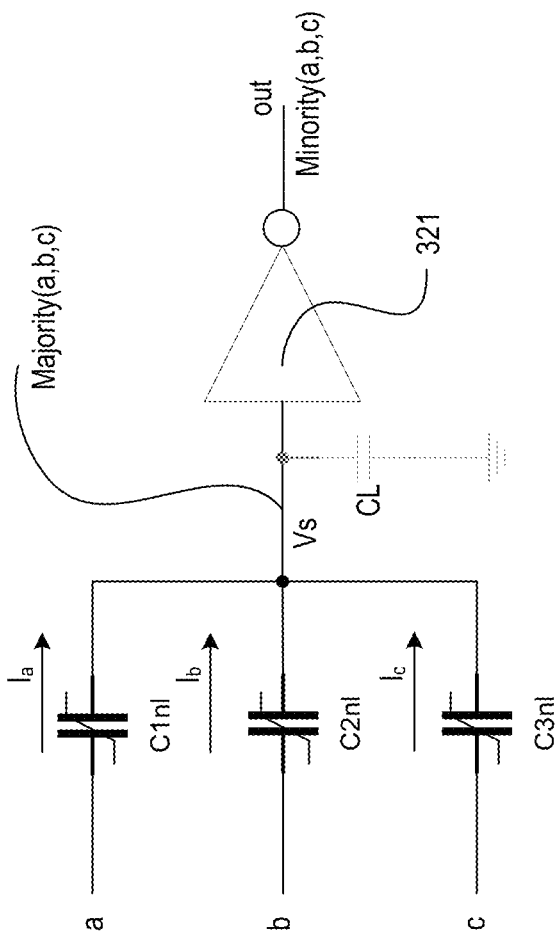
FIG. 3B illustrates a 3-input majority or minority gate with non-linear input capacitors, in accordance with some embodiments.

FIG. 3B illustrates 3-input majority or minority gate 320 with non-linear input capacitors, in accordance with some embodiments. In some embodiments, 3-input majority gate 320 comprises non-linear input capacitors C1nl, C2nl, and C3nl that receives digital signals a, b, and c, respectively. Here, signal names and node names are interchangeably used. For example, 'a' refers to node 'a' or signal 'a' depending on the context of the sentence. One end or terminal of capacitor C1nl is coupled to node a while the other end of capacitor C1n1 is coupled to summing node Vs. The same is true for other non-linear capacitors C2nl and C3nl as shown. In some embodiments, 3-input majority gate 320 comprises a driver circuitry 321. In this example, driver circuitry 321 is an inverter. In other embodiments, other types of driver circuitries can be used such as NAND gate, NOR gate, multiplexer, buffer, and other logic gates. The majority function is performed at summing node Vs as Majority(a,b,c). In this example, since driver 321 is an inverter, minority function is performed at output "out" as Minority(a,b,c).

In some embodiments, in addition to the gate capacitance of driver circuitry 321, an additional linear capacitor CL is coupled to summing node Vs and ground as shown. In some embodiments, this linear capacitor CL is a non-ferroelectric capacitor. In some embodiments, the non-ferroelectric capacitor includes one of: a dielectric capacitor, a paraelectric capacitor, or a non-linear dielectric capacitor. A dielectric capacitor comprises first and second metal plates with a dielectric between them. Examples of such dielectrics are: HfO, ABO3 perovskites, nitrides, oxy-fluorides, oxides, etc. A paraelectric capacitor comprises first and second metal plates with a paraelectric material between them. In some embodiments, f-orbital materials (e.g., lanthanides) are doped to the ferroelectric materials to make paraelectric material. Examples of room temperature paraelectric material include: SrTiO3, Ba(x)Sr(y)TiO3 (where x is −0.5, and y is 0.95), HfZrO2, Hf—Si—O, La-substituted PbTiO3, and/or PMN-PT based relaxor ferroelectrics. A dielectric capacitor comprises first and second metal plates with non-linear dielectric capacitor between them. The range for dielectric constant is 1.2 to 10000. The capacitor CL can be implemented as MIM (metal-insulator-metal) capacitor technology, transistor gate capacitor, hybrid of metal capacitors, or transistor capacitor. The capacitor CL can be implemented as MIM (metal-insulator-metal) capacitor technology, transistor gate capacitor, or hybrid of metal capacitors or transistor capacitor. In various embodiments, there is enough capacitance on node Vs that the capacitor CL is not needed.

In some embodiments, the non-linear input capacitors C1nl, C2nl, and C3nl comprise non-linear polar material. In some embodiments, the non-linear polar material includes one of: a ferroelectric (FE) material, a paraelectric material, a relaxor ferroelectric, or a non-linear dielectric. In various embodiments, paraelectric material is the same as FE material but with chemical doping of the active ferroelectric ion by an ion with no polar distortion. In some cases, the non-polar ions are non-s orbital ions formed with p, d, f external orbitals. In some embodiments, non-linear dielectric materials are same as paraelectric materials, relaxors, and dipolar glasses.

The majority function is performed at the summing node Vs, and the resulting voltage is projected on to capacitance of driver circuitry 321. Table 3 illustrates the majority function $f$(Majority a, b, c).

TABLE 3

| a | b | c | Vs (f(Majority a, b, c)) |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

The charge developed on node Vs produces a voltage and current that is the output of the majority gate 320. Any suitable driver 321 can drive this output. For example, a non-FE logic, FE logic, CMOS logic, BJT logic, etc., can be used to drive the output to a downstream logic. Examples of the drivers include inverters, buffers, NAND gates, NOR gates, XOR gates, amplifiers, comparators, digital-to-analog converters, analog-to-digital converters, multiplexers, etc.

While FIG. 3B illustrates a 3-input majority gate, the same concept can be extended to more than 3 inputs to make an N-input majority gate, where N is greater than 2. In various embodiments, 'N' is an odd number. For example, a 5-input majority gate is like input majority gate 320 but for additional inputs 'd' and 'e'. These inputs can come from the same drivers or from different drivers.

In some embodiments, the 3-input majority gate can be configured as a fast inverter with a much faster propagation delay compared to a similar sized (in terms of area footprint) CMOS inverter. This is particularly useful when the inputs have a significantly slower slope compared to the propagation delay through the non-linear input capacitors. One way to configurate the 3-input majority gate as an inverter is to set one input to a logic high (e.g., b=1) and set another input to a logic low (e.g., b=0). The third input is the driving input which is to be inverted. The inversion will be at the Vs node. The same technique can also be applied to N-input majority gate, where 'N' is 1 or any other odd number. In an N-input majority gate, (N−1)/2 inputs are set to '1' and (N−1)/2 inputs are set to '0', and one input is used to decide the inversion function. It will be appreciated that the various embodiments are described as a majority gate, the same concepts are applicable to a minority gate. In a minority gate the driving circuitry is an inverting circuitry coupled to the summing node Vs. The minority function is seen at the output of the inverting circuitry.

In some embodiments, (2N−1) input majority gate can operate as an N-input AND gate where (N−1) inputs of the majority gate are set to zero. The AND function will be seen at the summing node Vs. Similarly, N-input NAND, OR, and NOR gates can be realized. In various embodiments, the summing node Vs is driven by a driver circuitry (e.g., inverter, buffer, NAND gate, AND gate, OR gate, NOR gate, or any other logic circuitry). However, driver circuitry 321 can be replaced with another majority or minority gate. In one such embodiment, the storage node Vs is directly coupled to a non-linear capacitor of another majority or minority gate.

Any logic function $f(x_1, x_2, \ldots x_n)$ can be represented by two levels of logic as given by the min-term expansion: $f(x_1, x_2, \ldots x_n) = \vee_{C_1, C_2, \ldots C_n} f(x_1, x_2, \ldots x_n) \wedge x_1^{C_1} \wedge x_2^{C_1} \wedge x_3^{C_3} \ldots \wedge x_n^{C_n}$ where $C_i$ is either 0 or 1. When $C_i$ is 1, $x_i^{C_i} = x_i$ (the input is used in its original form). When $C_i$ is 0, $x_i^{C_i} = \overline{x}_i$ (the input is used in its inverted form). The first level of logic is represented by at most $2^n$ AND gates ($\Delta$), one for each of the $2^n$ possible combinations of 0 and 1 for $C_1, C_2, \ldots C_n$. The second level of logic is represented by a single OR gate (V). Each operand of the OR gate is a representation of a row in the truth table for $f(x_1, x_2, \ldots x_n)$.

A (2N−1)-input majority gate can represent an N-input AND gate, by tying (N−1) of the majority gate's inputs to a ground level. Similarly, a (2N−1)-input majority gate can represent an N-input OR gate, by tying (N−1) of the majority gate's inputs to a supply level (Vdd). Since a majority gate can represent AND and OR gates, and the inputs to the AND and OR gates are either original or inverted forms of the input digital signals, any logic function can be represented by majority gates and inverters only, in accordance with some embodiments.

Figure 3C:
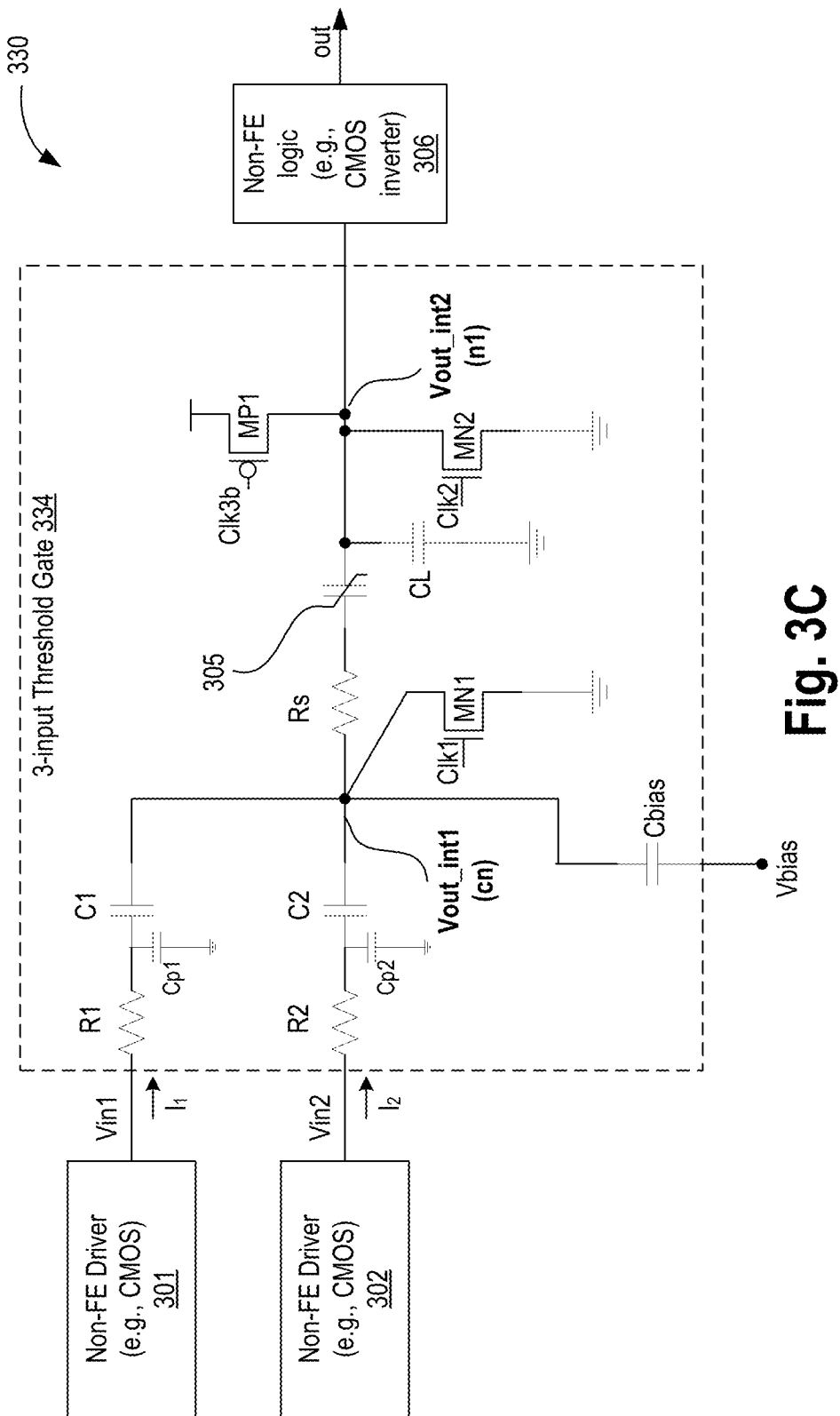
FIG. 3C illustrates a 3-input threshold gate with non-linear input capacitors, in accordance with some embodiments.

FIG. 3C illustrates 3-input threshold gate 330 with non-linear input capacitors, in accordance with some embodiments. Logic gate 330 is like logic gate 300 but for removing the third input Vin and adding an input Vbias. This additional input bias makes the logic gate a threshold gate 334. Threshold gate 334 is referred to as a 3-input threshold gate because of the three inputs Vin1, Vin2, and Vbias. It can also be referred to as 2-input threshold gate if the Vbias input is not counted as a separate input. In various embodiments, threshold gate 334 comprises an additional capacitor Cbias that has one terminal coupled to node cn and another terminal coupled to Vbias. The material for capacitor Cbias can be same as material for capacitors C1, C2, and C3. For example, capacitor Cbias comprises non-ferroelectric material.

Vbias can be positive or negative voltage depending on the desired logic function of threshold gate 334. Any suitable source can generate Vbias. For example, a bandgap reference generator, a voltage divider such as a resistor divider, a digital to analog converter (DAC), etc. can generate Vbias. Vbias can be fixed or programmable (or adjustable). For example, Vbias can be adjusted by hardware (e.g., fuses, register), or software (e.g., operating system). In some embodiments, when Vbias is positive, the majority function on node cn is an OR function. For example, the function at node cn is OR(Vin1, Vin2, 0). In some embodiments, when Vbias is negative, the majority function on node cn is an AND function. For example, the function at node cn is AND(Vin1, Vin2, 1). Table 4 and Table 5 summarize the function of threshold gate 334. Applying a positive voltage or Vbias can be akin to applying an input signal logic high as well. Likewise, applying a negative voltage on Vbias can be akin to applying an input signal logic low as well.

TABLE 4

| Vin1 | Vin2 | Vbias | cn OR(Vin1, Vin2, Vbias) |
| --- | --- | --- | --- |
| 0 | 0 | Positive or logic 1 | 0 |
| 0 | 1 | Positive or logic 1 | 1 |
| 1 | 0 | Positive or logic 1 | 1 |
| 1 | 1 | Positive or logic 1 | 1 |

TABLE 5

| Vin1 | Vin2 | Vbias | cn AND(Vin1, Vin2, Vbias) |
| --- | --- | --- | --- |
| 0 | 0 | Negative or logic 0 | 0 |
| 0 | 1 | Negative or logic 0 | 0 |
| 1 | 0 | Negative or logic 0 | 0 |
| 1 | 1 | Negative or logic 0 | 1 |

Compared to transitional CMOS AND logic gate and OR logic gate, here the AND function and OR function are performed by a network of capacitors. The output of the majority or threshold function on node cn is then stored in the non-linear polar capacitor 305. This capacitor provides the final state of the logic in a non-volatile form. As such, the logic gate of various embodiments describes a non-volatile multi-input AND or OR gate with one or two transistors for pre-discharging or pre-charging nodes cn and n1. The silicon area of the AND or OR gates of various embodiments is orders of magnitude smaller than traditional AND or OR gates. While FIG. 3C illustrates a 3-input threshold gate, the same concept can be extended to more than 3 inputs to make an N-input threshold gate, where N is greater than 2 and an odd number. The reset mechanism of FIG. 3C is like the one described with reference to FIG. 3A.

Figure 4:
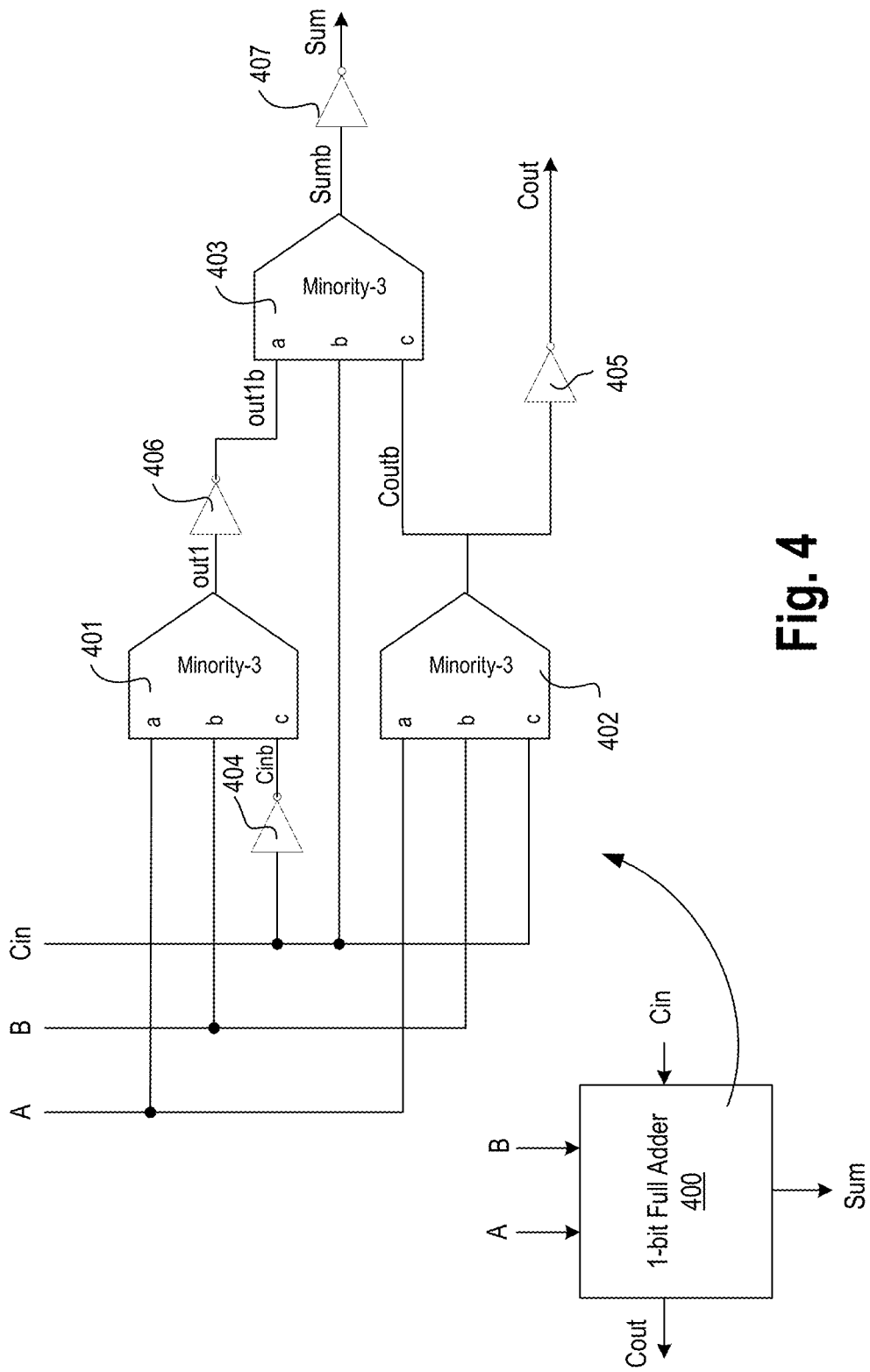
FIG. 4 illustrates a 1-bit 3-input minority gate-based adder with ferroelectric or paraelectric material, in accordance with some embodiments.

FIG. 4 illustrates 1-bit 3-input minority gate-based adder 400 with ferroelectric or paraelectric material, in accordance with some embodiments. Compared to adder 200, here majority gates are replaced with minority gates. In some embodiments, 1-bit full adder 400 comprises a first 3-input minority gate 401, a second 3-input minority gate 402, a third 3-input minority gate 403, a first inverter 404, a second inverter 405, third inverter 406, and fourth inverter 407. Each minority gate here has three inputs 'a', 'b', and 'c', which are coupled to various nodes as shown. In various embodiments, first 3-input minority gate 401 receives a first input (e.g., A), a second input (e.g., B), and an inverted version of a third input (e.g., Cinb), wherein the first input is a first operand, wherein the second input is a second operand, and wherein the third input is a carry-in bit. In various embodiments, the inverted version of a third input is generated by inverter 404. In some embodiments, inverter 404 can be replaced with any suitable inverting logic such as NAND gate, NOR gate, etc.

In various embodiments, first 3-input minority gate 401 generates a first output out1 which is a first minority function of the first input, the second input, and the inverted version of the third input. In some embodiments, second 3-input minority gate 402 receives the first input, the second input, and the third input. In various embodiments, second 3-input minority gate 402 generates second output Coutb which is a second minority function of the first input, the second input, and the third input. In some embodiments, third 3-input minority gate 403 receives an inverted version of the first output out1, the second output Coutb, and the third input. In various embodiments, the inverted version of the first output out1 is generated by inverter 406. In some embodiments, third 3-input minority gate 403 generates a third output Sumb which is a third minority function of out1b (which is an inverted version of the first output out1), the second output Coutb, and the third input Cin. In various embodiments, the third output Sumb is inverted by inverter 407 to generate Sum. In various embodiments, the second output Coutb is inverted by inverter 405 to generate Cout which is a carry-out, while the third output is a sum of the operands. In some embodiments, first 3-input minority gate 401, second 3-input minority gate 402, and third 3-input minority gate 403 include non-linear polar material. In some embodiments, the non-linear polar material includes one of: a ferroelectric material, a paraelectric material, or a non-linear dielectric.

In some embodiments, first 3-input minority gate 401 comprises a first capacitor that receives the first input, wherein the first capacitor is coupled to a node. In some embodiments, first 3-input minority gate 401 comprises a second capacitor that receives the second input, wherein the second capacitor is coupled to the node. In some embodiments, first 3-input minority gate 401 comprises a third capacitor that receives the inverted version of the third input, wherein the third capacitor is coupled to the node (e.g., summing node). In various embodiments, the first capacitor, the second capacitor, and the third capacitor include the non-linear polar material. A majority function of the inputs on the capacitor terminals is performed on the node. In some embodiments, first 3-input minority gate 401 comprises a driver circuitry having a capacitive input coupled to the node, and an output which converts the majority function on the node to a minority function output at the output of the driver circuitry. Other minority gates 402 and 403 have similar input capacitors with non-linear polar material.

In various embodiments, 1-bit full adder 400 is built with minority-3 gates. Minority gates can be fabricated directly or using majority gates and an inverter. Minority logic operation is inverse of majority logic operation. And, therefore, the full adder truth table can be mapped to minority gates as well. Here, the carry output Cout is synthesized as 3-input minority gate 402 followed by inverter 405 to get the majority function of the three inputs A, B, and Cin. Inverted carry bit Coutb gets reutilized to calculate the sum bit, which is an XOR of the three of its inputs, in accordance with various embodiments.

Figure 5:
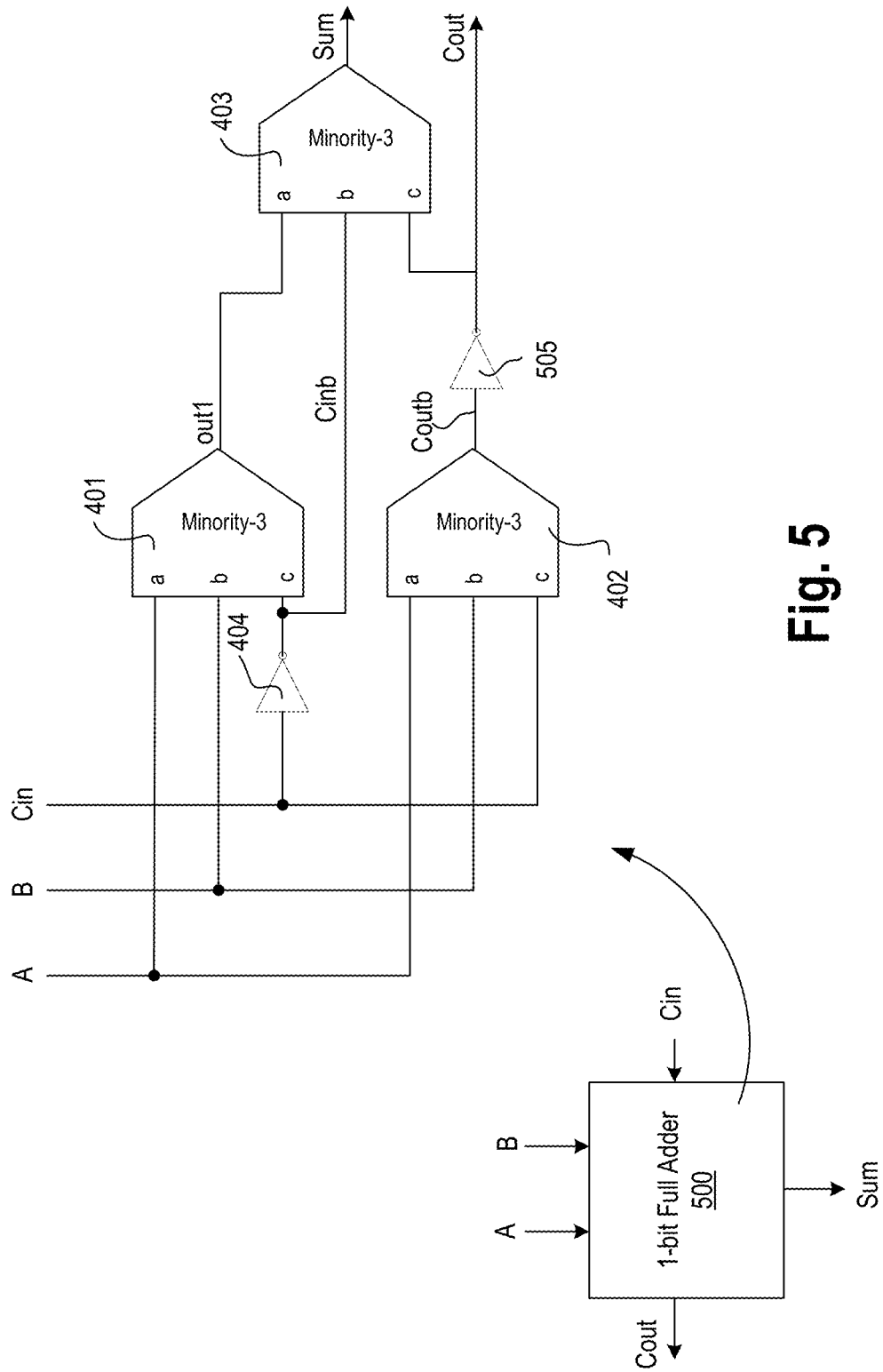
FIG. 5 illustrates a 1-bit 3-input minority gate-based adder with ferroelectric or paraelectric material and with fewer transistors than the adder of FIG. 4, in accordance with some embodiments.

FIG. 5 illustrates 1-bit 3-input minority gate-based adder 500 with ferroelectric or paraelectric material and with fewer transistors than the adder of FIG. 4, in accordance with some embodiments. Each minority gate here has three inputs 'a', 'b', and 'c', which are coupled to various nodes as shown. The inputs to first minority gate 401 and second minority gate 402 are same as those shown in adder 400. The inputs to third minority gate 403 are modified to reduce the number of inverters compared to adder 400. Compared to adder 400, inverter 406 is removed and the first output out1 is provided as input 'a' to third minority gate 403. Input 'b' of third minority gate 403 is Cinb, which is an inverted version of third input Cin. Input 'c' of third minority gate 403 is Cout which is an inverted version of the output of second minority gate 402. In some embodiments, adder 500 comprises inverter 505 which generates the inverted version of Coutb. As discussed herein, full adder 500 is very similar to adder 400, but uses inverters in different places. These different variations of the circuits play different roles while optimizing layout of these standard cells for power, performance, and area.

Figure 6:
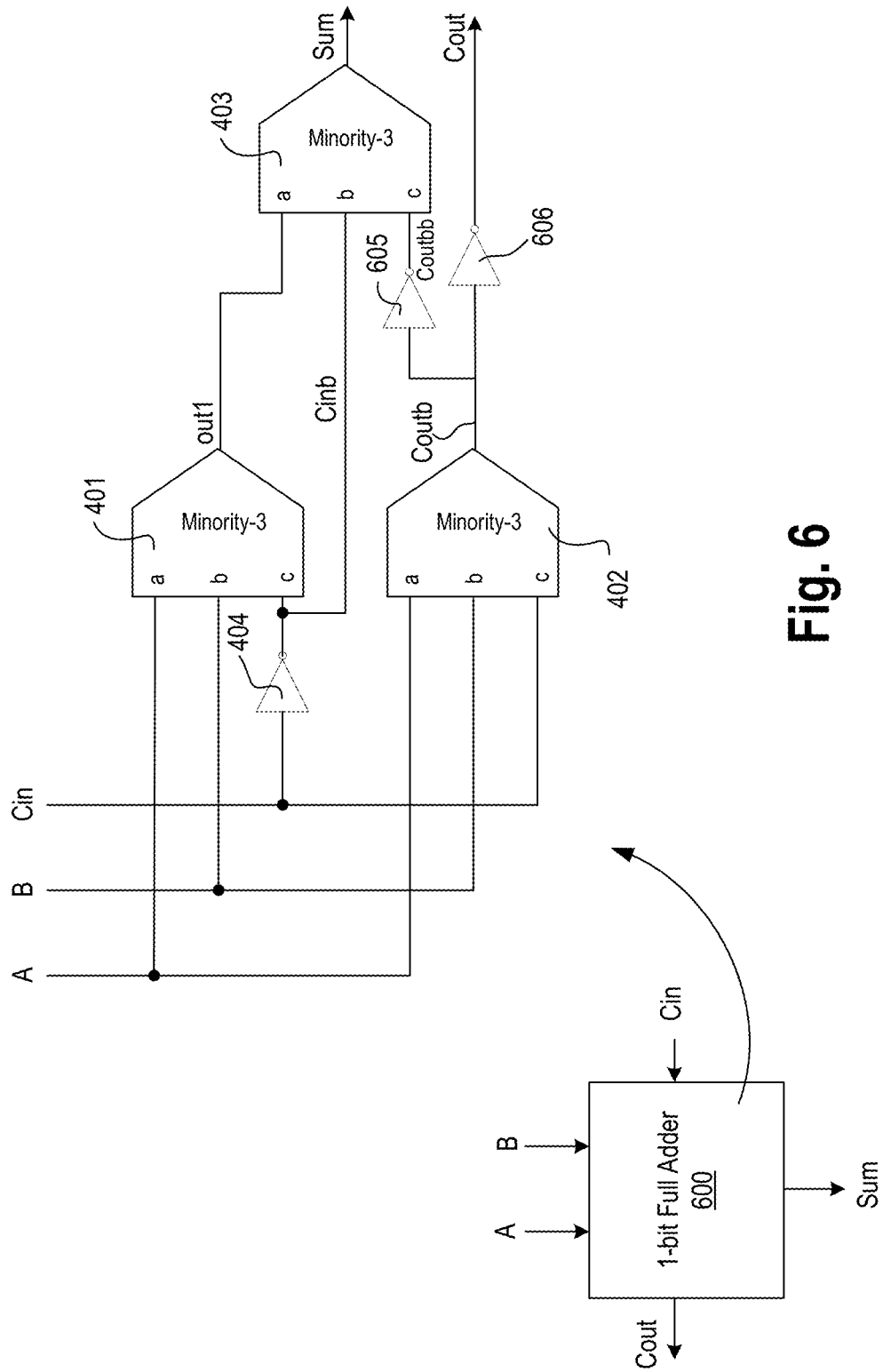
FIG. 6 illustrates a 1-bit 3-input minority gate-based adder with buffer carry path from a sum path, in accordance with some embodiments.

FIG. 6 illustrates 1-bit 3-input minority gate-based adder 600 with buffer carry path from a sum path, in accordance with some embodiments. Adder 600 is like adder 500. The inputs to first minority gate 401 and second minority gate 402 are same as those shown in adder 500. The inputs to third minority gate 403 are also same as those shown in adder 500. Here, the output of second minority gate 402 is split by two inverters 605 and 606. The output of inverter 605 is Coutbb (which is an inverted version of output Coutb, where Coutbb is logically same as Cout). The output of inverter 606 is Cout, which may be provided to another adder as input Cin, for example. Adder 600 is a variation of adders 400 or 500 and may provide trade-off of area, power, and delay by optimizing the fan-in count needed for the transistors of the inverters in the circuit for their drive strength and for removing glitches, in accordance with some embodiments.

Figure 7:
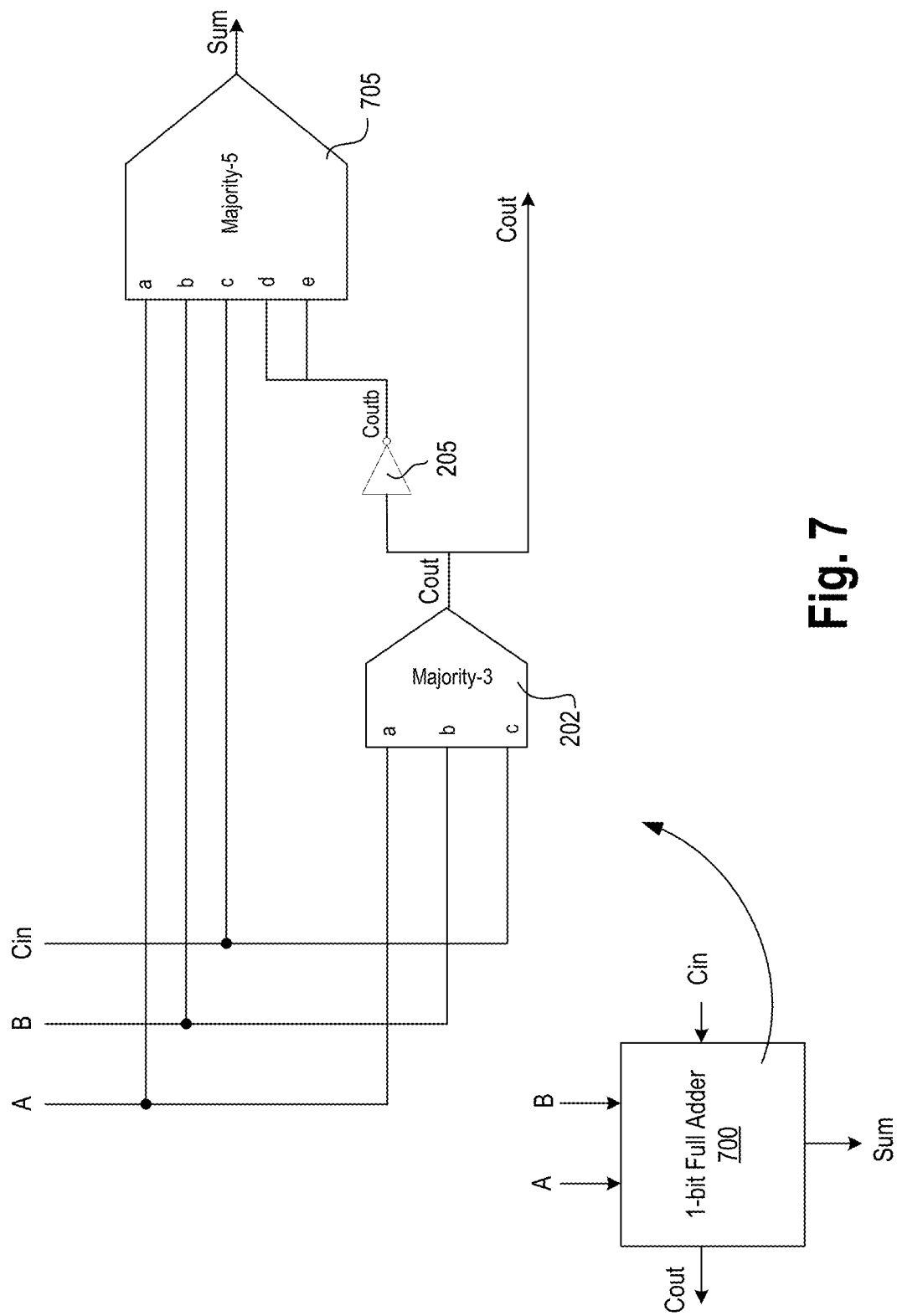
FIG. 7 illustrates a 1-bit full adder with 5-input majority gate, in accordance with some embodiments.

FIG. 7 illustrates 1-bit full adder 700 with 5-input majority gate, in accordance with some embodiments. Like various adders discussed herein, adder 700 has a depth of 2. Here depth refers to the number of majority or minority gates from inputs (e.g., A, B, and Cin) to output Sum. Adder 700 comprises 3-input majority gate 202, inverter 205, and 5-input majority gate 705. Inputs 'a,' 'b,' and 'c' of 3-input majority gate 202 are coupled to inputs A, B, Cin, respectively. The output Cout of 3-input majority gate 202 is inverted by inverter 205. In various embodiments, the output Coutb of inverter 205 is provided as inputs 'd' and 'e' of 5-input majority gate 705 while inputs 'a', 'b', and 'c' of 5-input majority gate 705 receives inputs A, B, and Cin, respectively. In various embodiments, majority gates 202 and 705 are implemented using one of the designs of FIG. 3A and FIG. 3B.

Like the 1-bit adder circuits described in other embodiments, adder 700 also uses 3-input majority operation for generating the carry output Cout. However, by using 5-input majority logic, the sum output can be synthesized using a single extra 5-input majority gate 705. Adder 700 has benefits in cases when a reliable 5-input majority or minority gate can be fabricated in a smaller area compared to two 3-input minority gates or two 3-input majority gates.

Figure 8:
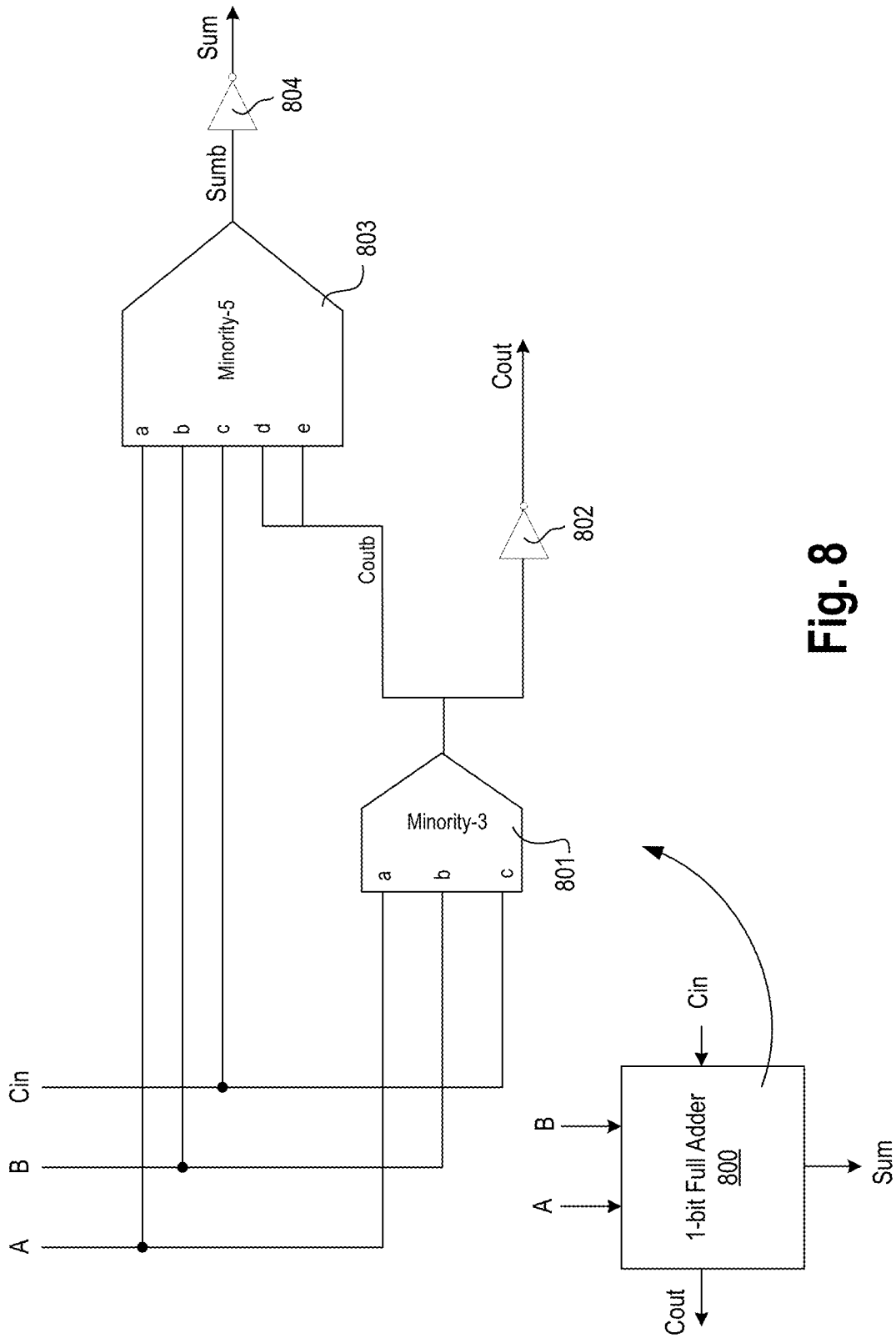
FIG. 8 illustrates a 1-bit full adder with 5-input minority gate, in accordance with some embodiments.

FIG. 8 illustrates 1-bit full adder 800 with 5-input minority gate, in accordance with some embodiments. Adder 800 has the same basic architecture as that of adder 700 but replaces the majority gates with minority gates. Adder 800 comprises 3-input minority gate 801, inverter 802, and 5-input minority gate 803. Inputs 'a', 'b', and 'c' of 3-input minority gate 801 are coupled to inputs A, B, Cin, respectively. The output Coutb of 3-input minority gate 801 is inverted by inverter 802 to generate Cout. In various embodiments, the output Cout of 3-input minority gate 801 is provided as inputs 'd' and 'e' of 5-input minority gate 803 while inputs 'a', 'b', and 'c' of 5-input minority gate 803 receives inputs A, B, and Cin, respectively. The output of 5-input minority gate 803 is Sumb, which is inverted by inverter 804 to generate sum. In various embodiments, minority gates 801 and 803 are implemented using one of the designs of FIG. 3A and FIG. 3B.

Adder 800 is logically equivalent to adder 700 with the Boolean algebra. In some embodiments, minority gates are used instead of majority gates as the basic gates. In some embodiments, where inverter is plugged in at the summation node of the capacitive logic, it provides higher resolution to separate out Boolean logic levels of 0 and 1, and in some cases may be preferred over majority gate based implementations.

Figure 9A:
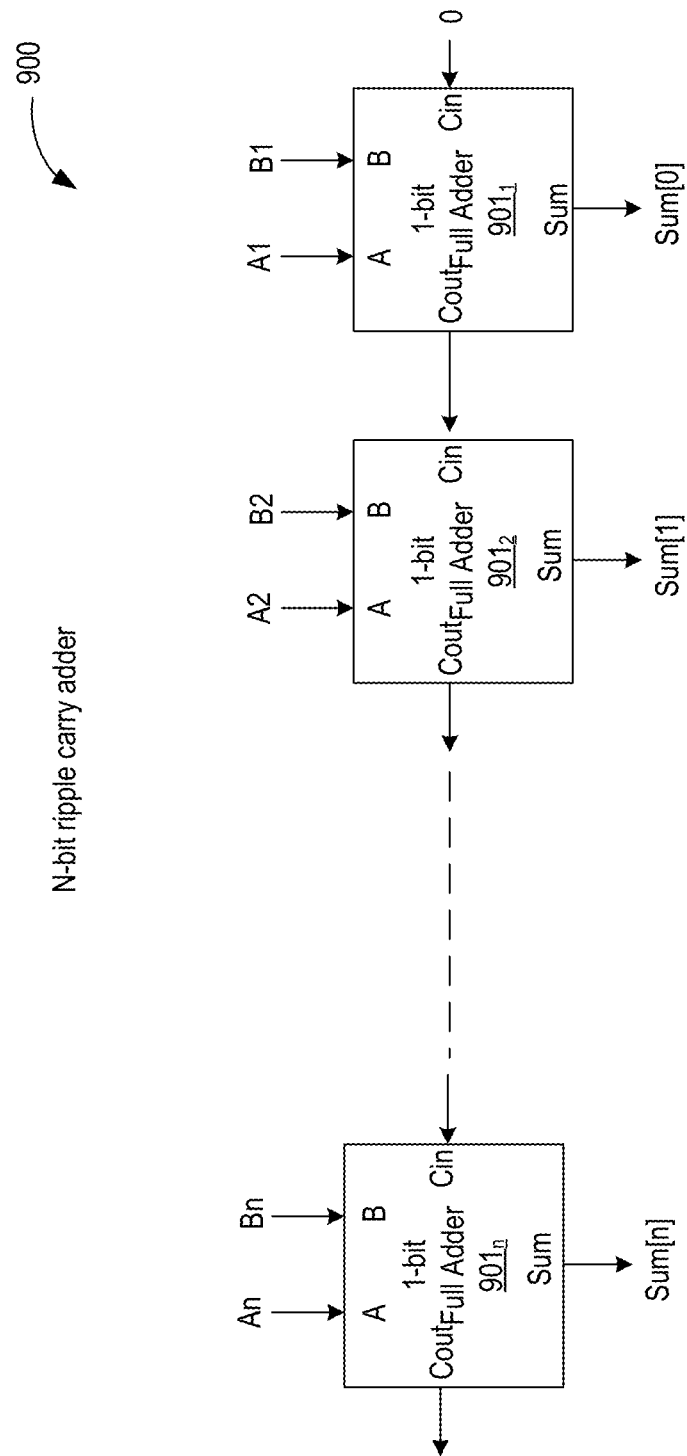
FIG. 9A illustrates an n-bit ripple carry adder, in accordance with some embodiments.

FIG. 9A illustrates n-bit ripple carry adder 900, in accordance with some embodiments. Adder 900 comprises N 1-bit full-adders, where each 1-bit full adder of the N adders is designed as discussed herein, in accordance with some embodiments. Here, multiple 1-bit adders $901_1$ through $901_1$ are concatenated to form N-bit adder 900. Adder 900 is used for the purpose of adding two n-bit binary numbers. Adder 900 uses 'n' full adders in its circuit for adding two n-bit binary numbers. Adder 900 is also referred to as an n-bit parallel adder. Each 1-bit adder receives its corresponding inputs and provides the carry Cout to the subsequent stage (e.g., next 1-bit adder). For example, adder $901_1$ receives operands A1 and B1 as inputs with carry-in bit Cin set to logical 0, adder $901_2$ receives operands A2 and B2 as inputs with carry-in bit Cin provided from carryout Cout of adder $901_1$, and adder 901 receives operands An and Bn as inputs with carry-in bit Cin provided from carryout Cout of adder $901_{n-1}$.

Figure 9B:
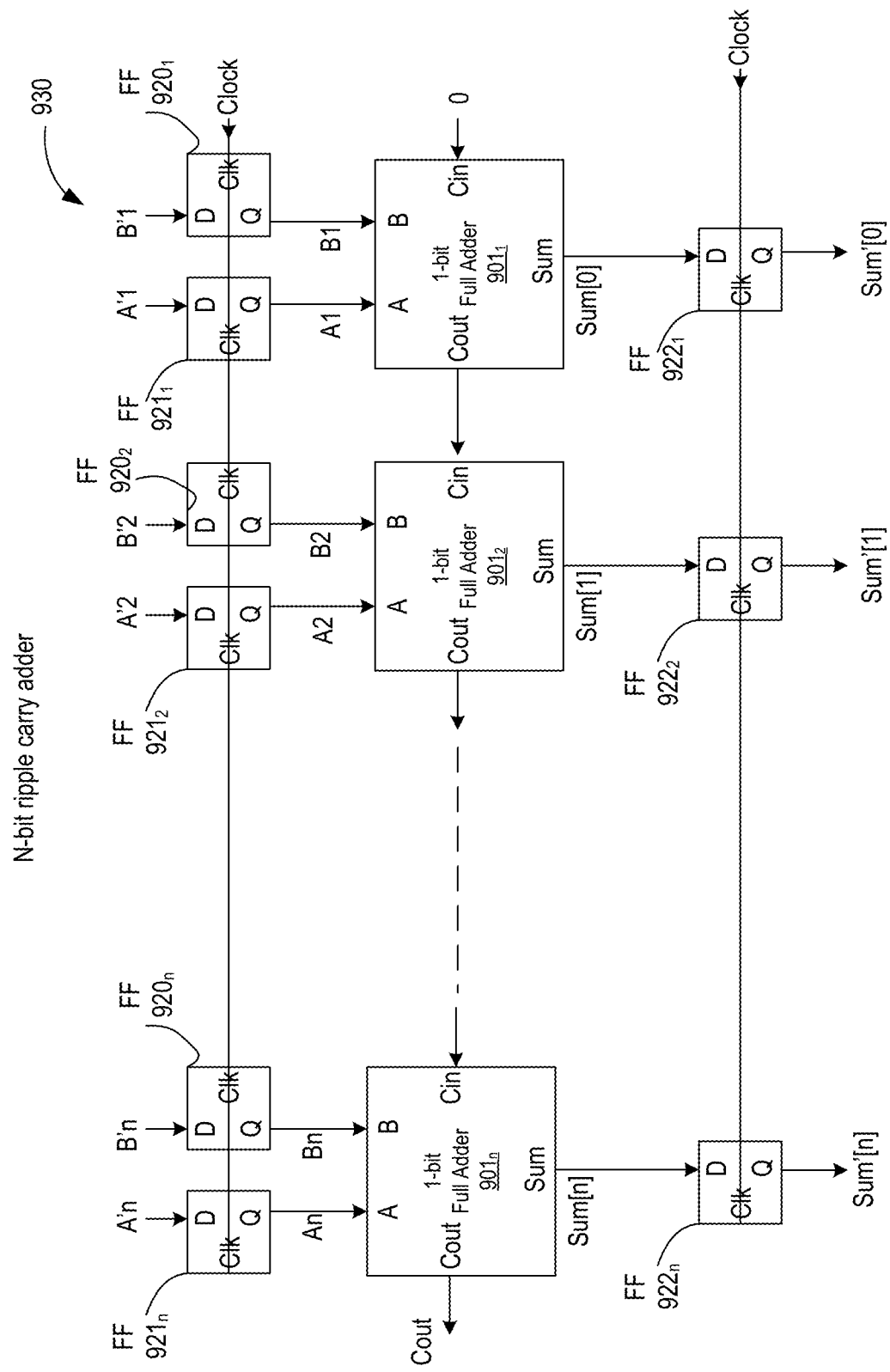
FIG. 9B illustrates an n-bit ripple carry adder with flip-flops at the inputs and outputs, in accordance with some embodiments.

FIG. 9B illustrates n-bit ripple carry adder 930 with flip-flops at the inputs and outputs, in accordance with some embodiments. N-bit ripple carry adder 930 is like n-bit ripple carry adder 900 but for sequential circuits 920 and 921 for inputs (multiplier and multiplicand) of the adders 901, and sequential circuit 922 at the sum outputs. Here, a plurality of sequential circuits $920_1$ through $920_1$ is referred by their general label 920. Likewise, a plurality of sequential circuits $921_1$ through $921_1$ is referred by their general label 921, and a plurality of sequential circuits $922_1$ through $922_1$ is referred by their general label 922. In this example, the sequential circuits are flip-flops (FFs). However, any suitable sequential circuit may be used. In some embodiments, the same clock is applied to sequential circuits 920 and 921, and sequential circuits 922. In some embodiments, different clocks are applied to sequential circuits 920 and 921, and sequential circuits 922. For example, clock from sequential circuits 922 is phase shifted related to the clock for sequential circuits 920 and 921. In some embodiments, data inputs A'1 and B'1 are received by FF $921_1$ and FF $920_1$, respectively, and their sampled outputs A1 and B1 are provided as inputs A and B to 1-bit full adder $901_1$. Likewise, data inputs A'2 and B'2 are received by FF $921_2$ and FF $920_2$, respectively, and their sampled outputs A2 and B2 are provided as inputs A and B to 1-bit full adder $901_2$. Similarly for the nth case, data inputs A'n and B'n are received by FF $921_n$ and FF $920_n$, respectively, and their sampled outputs An and Bn are provided as inputs A and B to 1-bit full adder $901_n$.

In some embodiments, the outputs of adders 901 are also sampled. In some embodiments, output Sum[0] of adder $901_1$ is sampled by FF $922_1$ to generate sampled output Sum'[0]. Likewise, output Sum[1] of adder $901_2$ is sampled by FF $922_2$ to generate sampled output Sum'[1]. Similarly, output sum[n] of adder $901_n$ is sampled by FF $922_n$ to generate sampled output Sum' [n]. In some embodiments, FFs 920, 921, and 922 comprise ferroelectric logic or paraelectric logic (e.g., majority, minority, and/or threshold gates). In some embodiments, FFs 920, 921, and 922 comprise a mix of ferroelectric logic (or paraelectric logic) and non-ferroelectric logic (e.g., CMOS logic). In some embodiments, FFs 920, 921, and 922 comprise non-ferroelectric logic (e.g., CMOS logic).

Figure 10A:
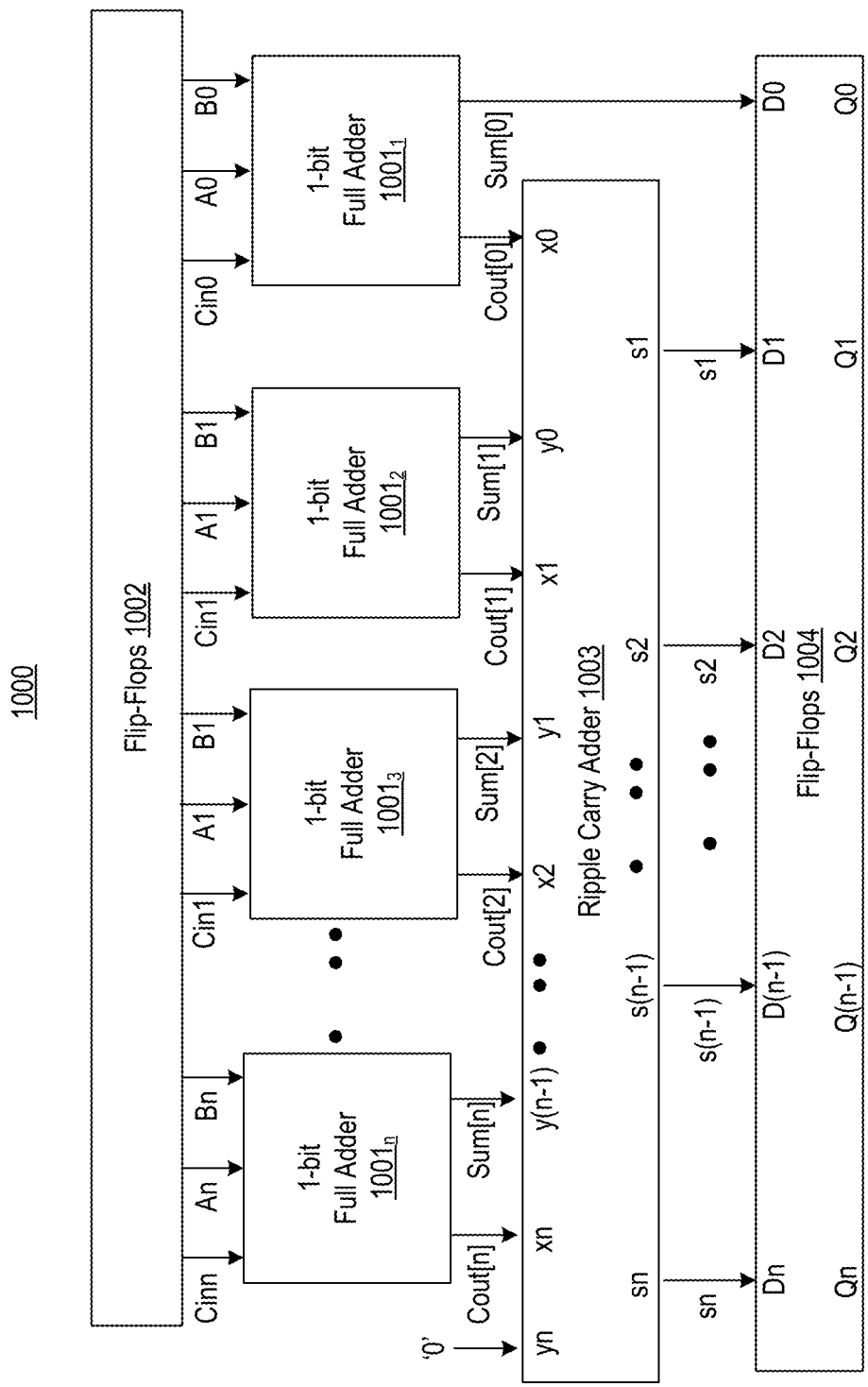
FIG. 10A illustrates an n-bit carry save adder with flip-flops, in accordance with some embodiments.

FIG. 10A illustrates n-bit carry save adder 1000 with flip-flops, in accordance with some embodiments. In some embodiments, adder 1000 comprises 'n' number of 1-bit full adders $1001_1$ through $1001_n$. Each of these adders can be any one of the adders described herein. Carry-save adder 1000 is a type of digital adder, used to efficiently compute the sum of three or more binary numbers. Carry-save adder 1000 differs from other digital adders in that it outputs two (or more) numbers, and the answer of the original summation can be achieved by adding these outputs together. In some embodiments adder 1000 comprises flip-flops 1002 that generate operands A0 through An, B0 through Bn, and Cin0 through Cinn. These operands A0 through An, B0 through Bn, and Cin0 through Cinn are synchronized to a clock edge. In some embodiments adder 1000 comprises ripple carry adder 1003. In some embodiments, ripple carry adder 1003 may be like ripple carry adder 900. Here, x0, y0 correspond to A1, B1 in adder 900, s1 corresponds to Sum[0] of adder 900, and carry-in signals Cin are internal to rippler carry adder 1003. The sum outputs of adder 1003 are sampled by flip-flops 1004. In inputs to flip-flops 1004 are D0 through Dn while the outputs of flip-flops 1004 are Q0 through Qn. In some embodiments, flip-flops 1002 and 1004 comprise ferroelectric or paraelectric logic (e.g., majority, minority, and/or threshold gates). In some embodiments, flip-flops 1002 and 1004 comprise a mix of ferroelectric logic (or paraelectric logic) and non-ferroelectric logic (e.g., CMOS logic). In some embodiments, flip-flops (FFs) 1002 and 1004 comprise non-ferroelectric logic (e.g., CMOS logic).

In some embodiments, n-bit carry save adder 1000 comprises a first 1-bit adder $1001_1$ to receive a first input A0, a second input B0, and a third input Cin0. Here, the first input A0 is a first operand, the second input B0 is a second operand, and the third input is a first carry-in input Cin0. First 1-bit adder $1001_1$ generates a first sum Sum[0] output and a first carry output Cout[0]. In some embodiments, n-bit carry save adder 1000 comprises a second 1-bit adder $1001_2$ to receive a fourth input Al, a fifth input Bi, and a sixth input Cin1. Here, the fourth input AI is a third operand, the fifth input B1 is a fourth operand, and the sixth input Cin1 is a second carry-in input Cin1. Second 1-bit adder $1001_2$ generates a second sum output Sum[1] and a second carry output Cout[1]. In some embodiments, n-bit carry save adder 1000 comprises a ripple carry adder 1003. In some embodiments, ripple carry adder 1003 is coupled to first 1-bit adder $1001_1$ and the second 1-bit adder $1001_2$. In some embodiments, ripple carry adder 1003 receives the first carry output Cout[0], the second sum output Sum[1], and the second carry output Cout[1]. First 1-bit adder $1001_1$ and the second 1-bit adder $1001_2$ comprise capacitors with non-linear polar material.

In various embodiments, ripple carry adder 1003 comprises a first 1-bit full-adder (not shown here, but same as $901_1$) to receive a seventh input (A of $901_1$), an eighth input (B of $901_1$), a ninth input (Cin of $901_1$). The seventh input (A of $901_1$) is a first operand which is coupled to the first carry output Cout[0]. The eighth input (B of $901_1$) is a second operand which is coupled to the second sum output Sum[1]. The ninth input (Cin of $901_1$) is a carry-in input which is coupled to a ground. In various embodiments, first 1-bit full-adder $901_1$ generates a first ripple sum output S1 and a first ripple carry output Cout of $901_1$.

In some embodiments, the ripple carry adder 1002 comprises a second 1-bit full-adder (not shown here, but same as $901_2$) to receive a tenth input (A of $901_2$), an eleventh input (B of $901_2$), and a twelfth input (Cin of $901_3$). The tenth input (A of $901_2$) is a first operand which is coupled to the second carry output Cout[1]. The eleventh input (B of $901_2$) is a second operand which is coupled to a third sum output Sum[2]. The twelfth input is a carry-in input which is coupled to the first ripple carry output, wherein the second 1-bit full-adder is to generate a second ripple sum S2 output and a second ripple carry output. In some embodiments, the third sum output Sum[2] is generated by a third 1-bit adder (e.g., $1001_3$) coupled to ripple carry adder 1003. As such, ripple carry adder couples to 1-bit full adders 1001. The outputs of ripple carry adder 1003 can be sampled by sequential circuits (e.g., FF 1004). FF 1004 can include ferroelectric logic (e.g., majority, minority, or threshold gates).

Figure 10B:
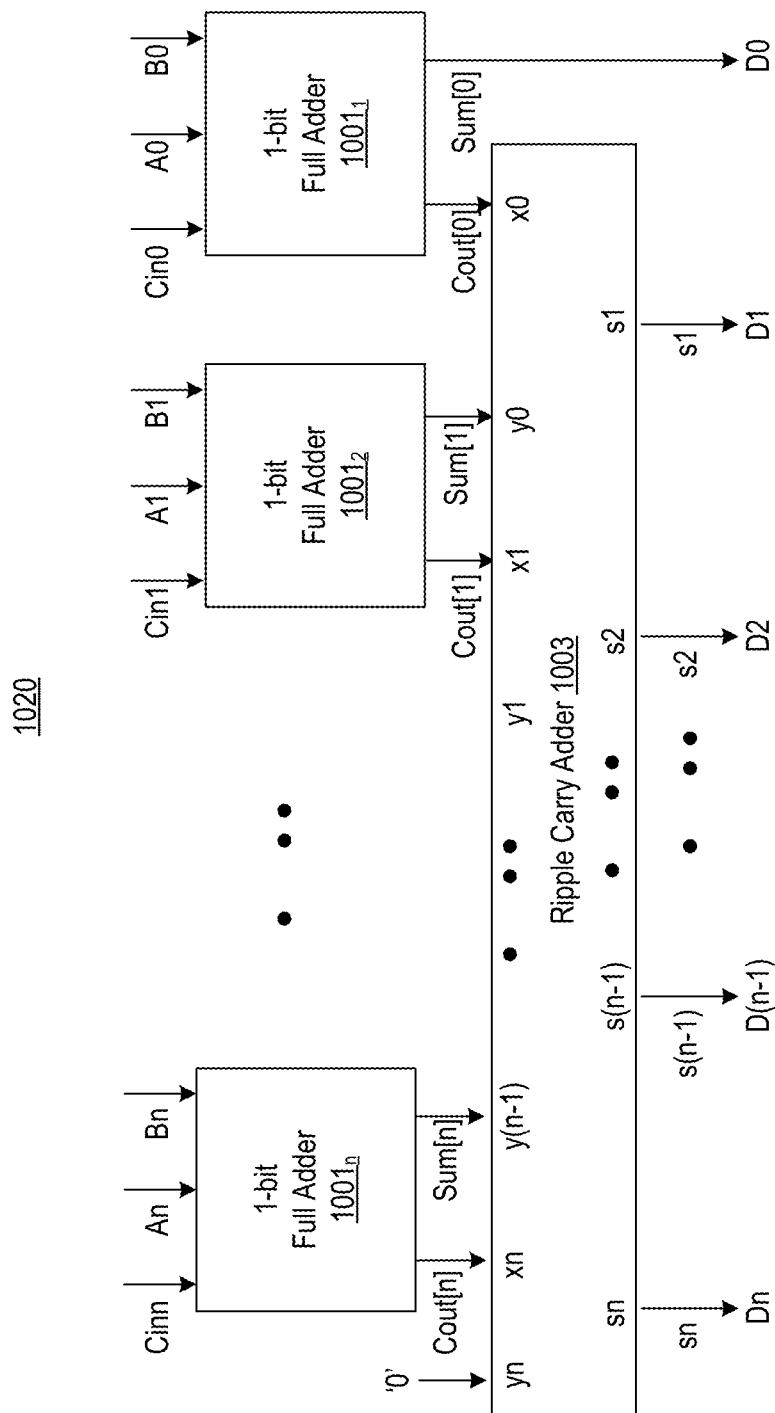
FIG. 10B illustrates an n-bit carry save adder without flip-flops, in accordance with some embodiments.

FIG. 10B illustrates n-bit carry-save adder 1020 without flip-flops, in accordance with some embodiments. n-bit carry save adder 1020 is like n-bit carry save adder 1000 but without flip-flops 1002 and 1004.

Figure 11A:
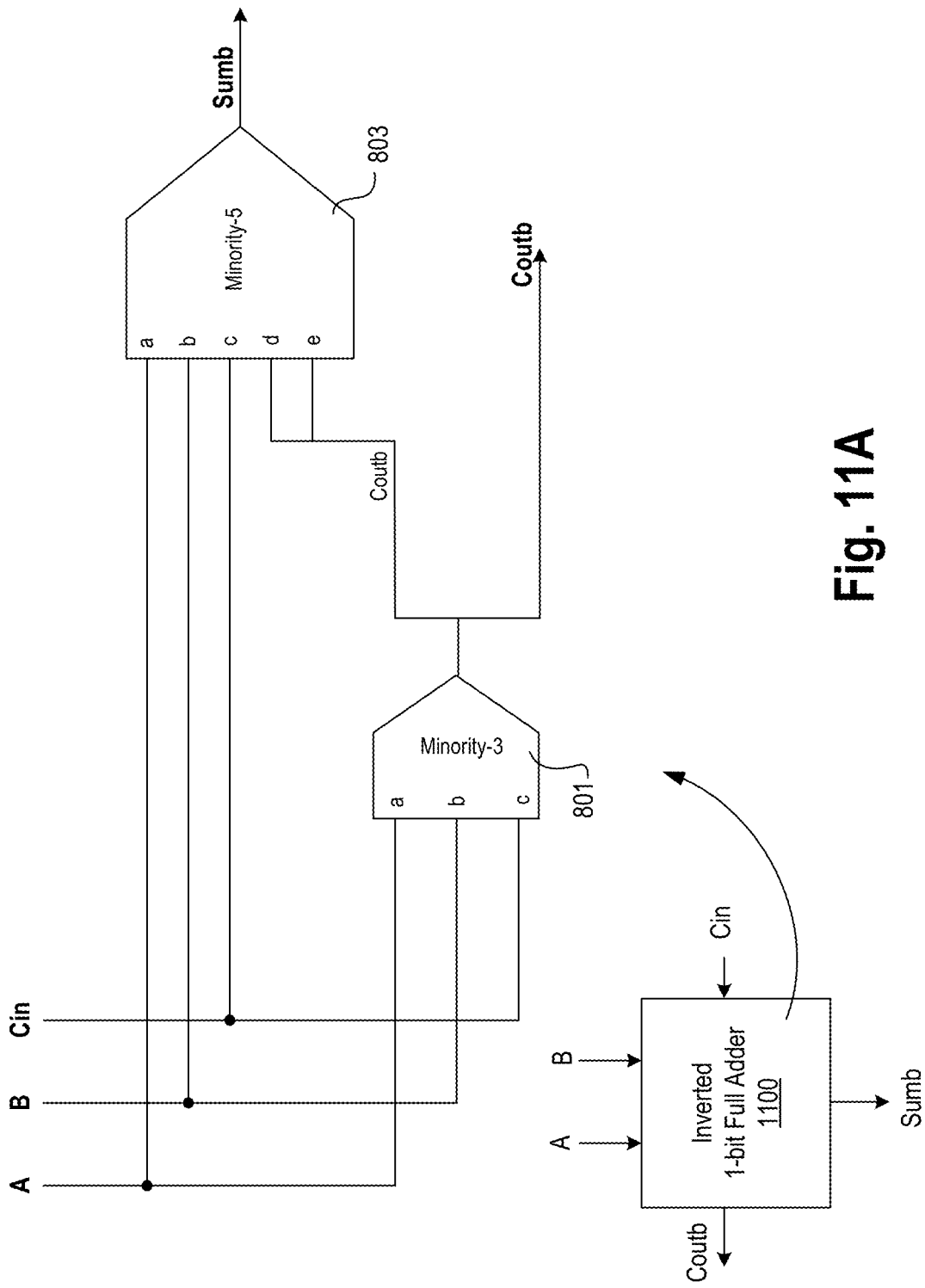
FIG. 11A illustrates a 1-bit inverted full adder, in accordance with some embodiments.

FIG. 11A illustrates 1-bit inverter full adder 1100, in accordance with some embodiments. In some embodiments, it may be desirable to generate inverted sum (sumb) and carry out signal Coutb to reduce overall logic delay. One such example of an adder is illustrated by adder 1100. Adder 1100 comprises 3-input minority gate 801 and 5-input minority gate 803. Inputs 'a', 'b', and 'c' of 3-input minority gate 801 are coupled to inputs A, B, and Cin, respectively. The output Coutb of 3-input minority gate 801 is provided as inputs 'd' and 'e' of 5-input minority gate 803 while inputs 'a', 'b', and 'c' of 5-input minority gate 803 receive inputs A, B, and Cin, respectively. In various embodiments, minority gates 801 and 803 are implemented using one of the designs of FIG. 3A and FIG. 3B.

In 1-bit inverted full adder 1100, the outputs of the circuit are inverted sum (sumb) and inverted carry (Coutb), rather than sum and carry, respectively. 1-bit inverted full adder 1100 is highly useful to optimize the number of inverters in a bigger circuit, where the inverted versions of carry and sum outputs of the full adder cell can be used.

Figure 11B:
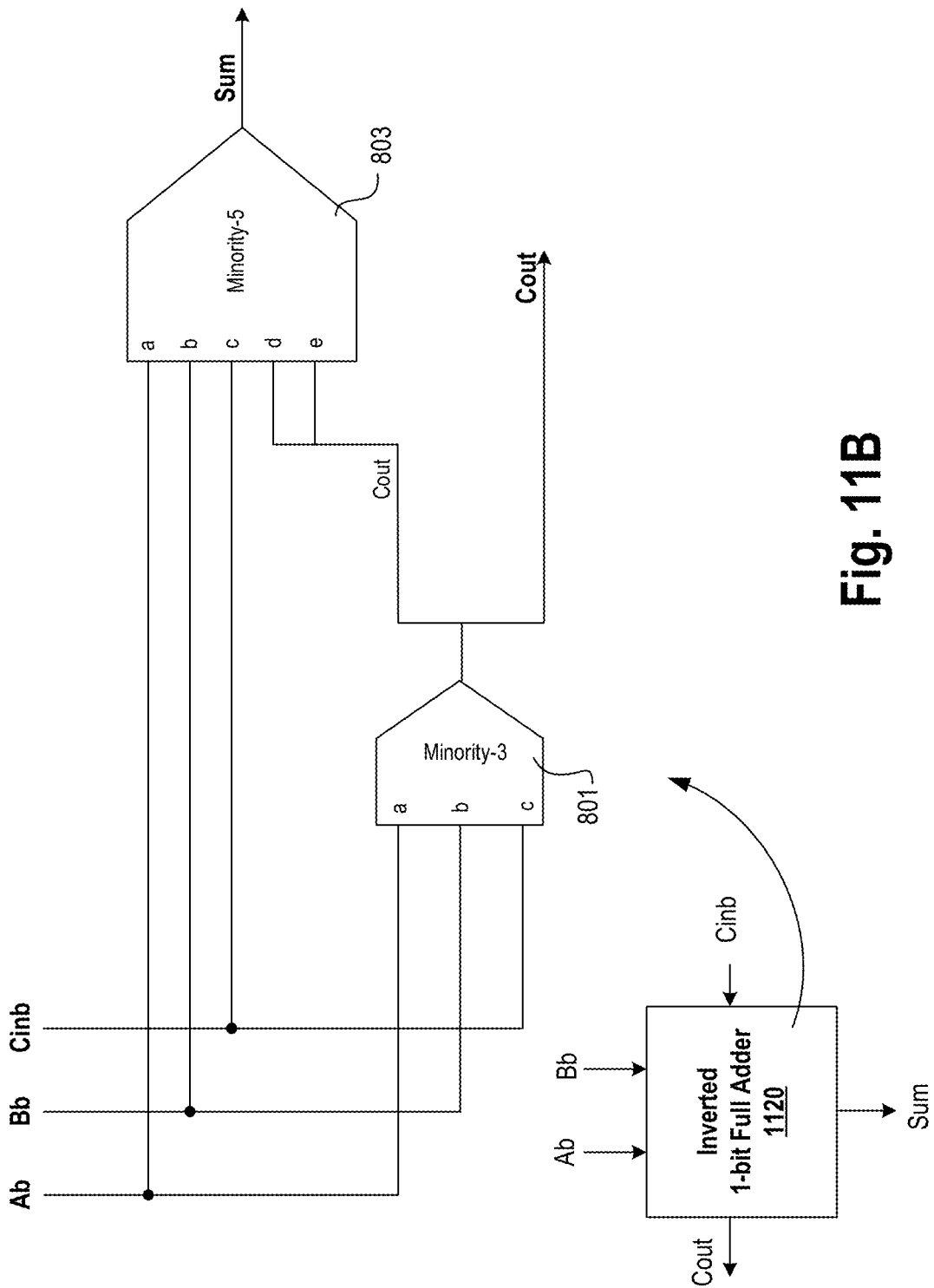
FIG. 11B illustrates a 1-bit inverted full adder where inputs are inverted, in accordance with some other embodiments.

FIG. 11B illustrates 1-bit inverted full adder 1120, in accordance with some other embodiments. In some embodiments, it may be desirable to generate sum and carry out signal Cout using inverted operands Ab, Cb, and carry-in Cinb to reduce overall logic delay. One such example of an adder is illustrated by adder 1120. Adder 1120 comprises 3-input minority gate 801 and 5-input minority gate 803. Inputs 'a', 'b', and 'c' of 3-input minority gate 801 are coupled to inverted inputs Ab, Bb, and Cinb, respectively. The output Cout of 3-input minority gate 801 is provided as inputs 'd' and 'e' of 5-input minority gate 803 while inputs 'a', 'b', and 'c' of 5-input minority gate 803 receive inverted inputs Ab, Bb, and Cinb, respectively. In various embodiments, minority gates 801 and 803 are implemented using one of the designs of FIG. 3A and FIG. 3B.

Figure 11C:
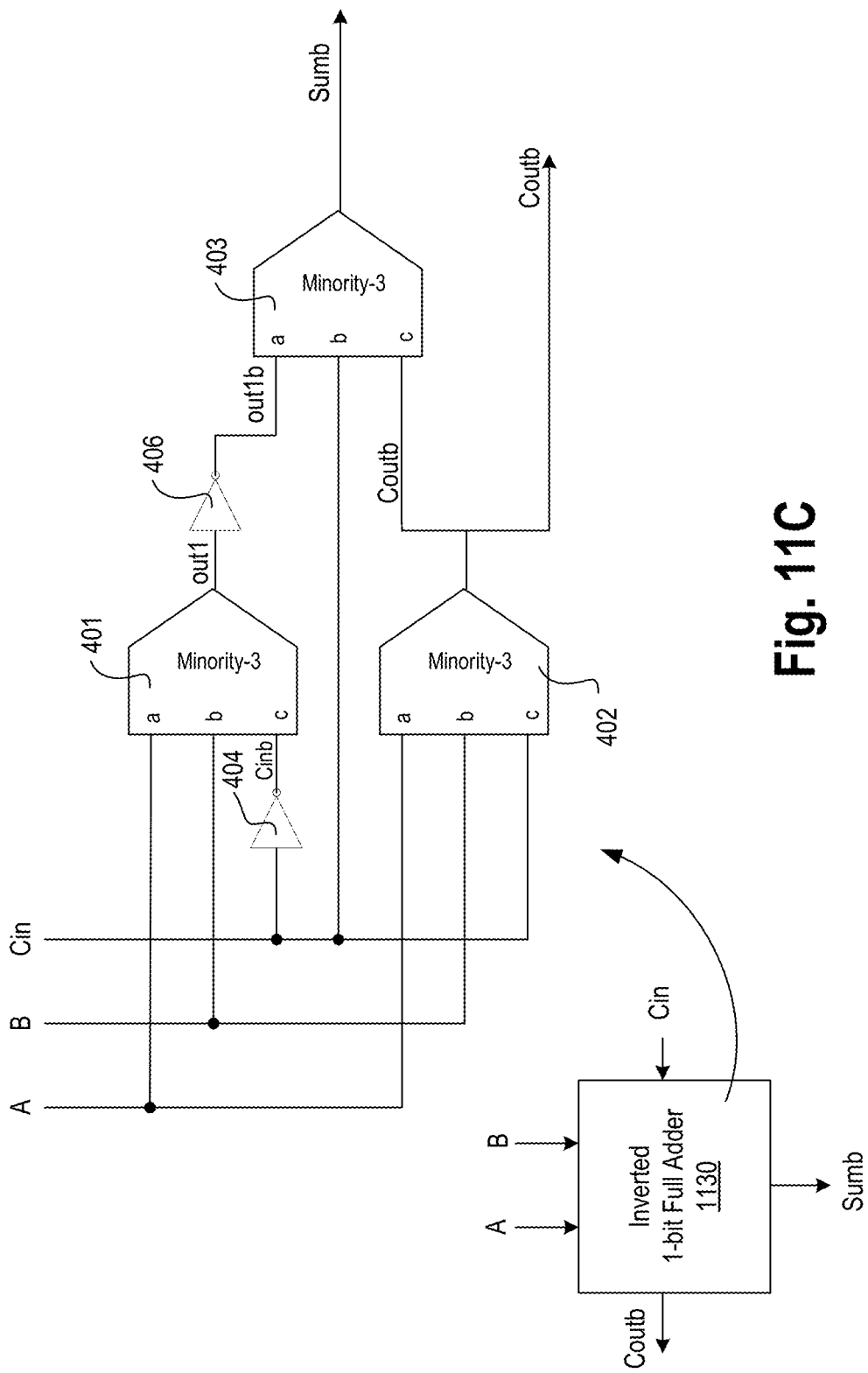
FIG. 11C illustrates a 1-bit inverted full adder, in accordance with some embodiments.

FIG. 11C illustrates 1-bit inverted full adder 1130, in accordance with some embodiments. 1-bit inverted full adder 1130 is like 1-bit full adder 400 but without output inverters 405 and 407. As such, output of 1-bit inverted full adder 1130 is Sumb and Coutb.

Figure 12:
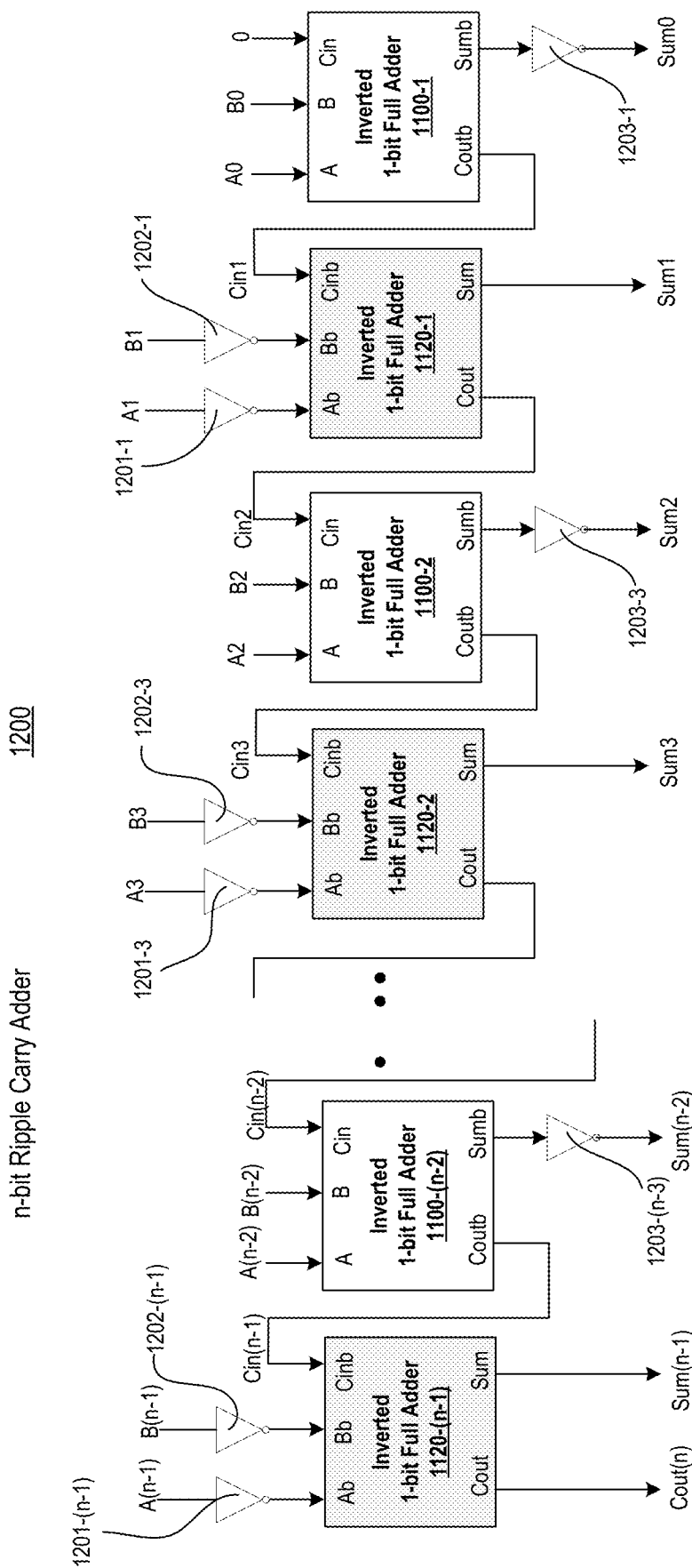
FIG. 12 illustrates an n-bit ripple carry adder using 1-bit inverted full adders of FIG. 11A or FIG. 11C and FIG. 11B, in accordance with some embodiments.

FIG. 12 illustrates an n-bit ripple carry adder 1200 using 1-bit inverted full adders of FIG. 11A or FIG. 11C and FIG. 11B, in accordance with some embodiments. In some embodiments, adder 1200 is like n-bit ripple carry adder 900 but using the two embodiments of 1-bit inverted full adders alternatively. In some embodiments, n-bit ripple carry adder 900 has 'n' inverted 1-bit adders of a first type (e.g., 1100-0 through 1100-($n$−1)) and 'n' inverted 1-bit adders of a second type (e.g., 1120-0 through 1120-($n$−1)). In various embodiments, adder 1200 includes inverters 1201-1 through 1201-($n$−1), inverters 1202-1 through 1202-($n$−1), and inverters 1203-1 through 1203-($n$−3). In some embodiments, the inverters can be replaced with other non-inverting logic such as NAND or NOR gates.

Inputs operands A and B that are received by the second type of adders are first inverted by respective inverters. For example, inputs A1 and B1 are inverted by inverters 1201-1 and 1202-1 (referred here generally as 1201 and 1202), respectively, before they are input to adder 1120-1. The inverted carry-out output Coutb from adder 1120-1 is received as carry-in input by the subsequent adder 1100-2. Inputs operands A and B that are received by the first type of adders are not inverted. The Sumb output from first type of adders is inverted. For example, inverter 1203-1 (generally referred to as 1203) inverts Sumb from 1100-1 to Sum0. This type of design is an example of optimizing a bigger circuit using the full-adder standard cells. Since, the full adder is a symmetric block, it can be used in this way to remove extra inverters from sum and carry paths wherever their inverted versions save overall number of transistors.

Figure 13:
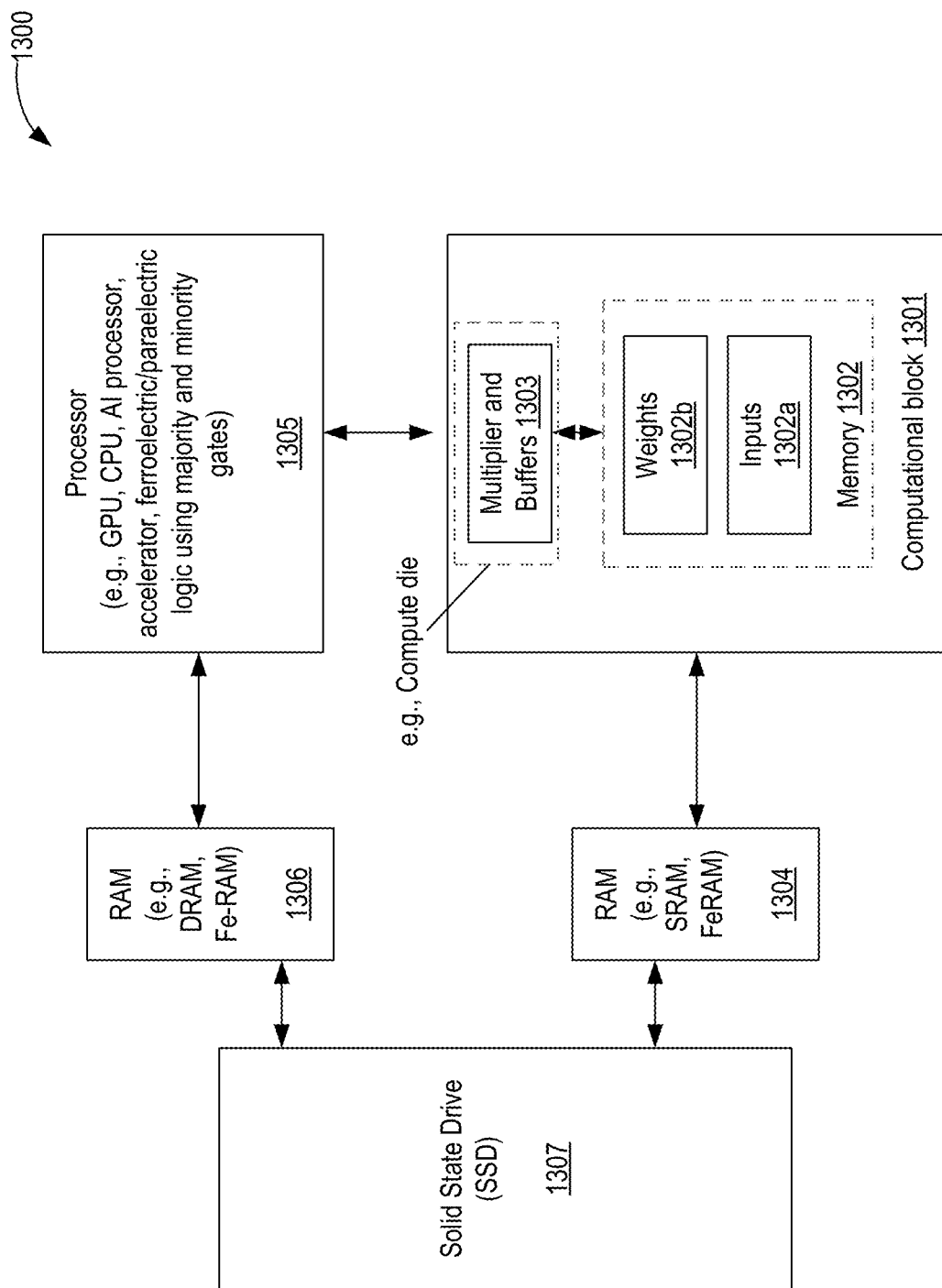
FIG. 13 illustrates a high-level architecture of an artificial intelligence (AI) machine comprising a compute die positioned on top of a memory die, wherein the compute die includes one or more adders in accordance with some embodiments.

FIG. 13 illustrates a high-level architecture of an artificial intelligence (AI) machine comprising a compute die positioned on top of a memory die, wherein the compute die includes one or more adders in accordance with some embodiments. Any of the blocks here can have the adder of various embodiments. AI machine 1300 comprises computational block 1301 or processor having random-access memory (RAM) 1302 and computational logic 1303; first random-access memory 1304 (e.g., static RAM (SRAM), ferroelectric or paraelectric RAM (FeRAM), ferroelectric or paraelectric static random-access memory (FeSRAM)), main processor 1305, second random-access memory 1306 (dynamic RAM (DRAM), FeRAM), and solid-state memory or drive (SSD) 1307. In some embodiments, some or all components of AI machine 1300 are packaged in a single package forming a system-on-chip (SoC). The SoC can be configured as a logic-on-logic configuration, which can be in a 3D configuration or a 2.5D configuration.

In some embodiments, computational block 1301 is packaged in a single package and then coupled to processor 1305 and memories 1304, 1306, and 1307 on a printed circuit board (PCB). In some embodiments, computational block 1301 is configured as a logic-on-logic configuration, which can be in a 3D configuration or a 2.5D configuration. In some embodiments, computational block 1301 comprises a special purpose compute die 1303 or microprocessor. For example, compute die 1303 is a compute chiplet that performs a function of an accelerator or inference. In some embodiments, memory 1302 is DRAM which forms a special memory/cache for the special purpose compute die 1303. The DRAM can be embedded DRAM (eDRAM) such as 1T-1C (one transistor and one capacitor) based memories. In some embodiments, RAM 1302 is ferroelectric or paraelectric RAM (Fe-RAM).

In some embodiments, compute die 1303 is specialized for applications such as Artificial Intelligence, graph processing, and algorithms for data processing. In some embodiments, compute die 1303 further has logic computational blocks, for example, for multipliers and buffers, a special data memory block (e.g., buffers) comprising DRAM, FeRAM, or a combination of them. In some embodiments, RAM 1302 has weights and inputs stored in-order to improve the computational efficiency. The interconnects between processor 1305 (also referred to as special purpose processor), first RAM 1304 and compute die 1303 are optimized for high bandwidth and low latency. The architecture of FIG. 13 allows efficient packaging to lower the energy, power, or cost and provides for ultra-high bandwidth between RAM 1302 and compute chiplet 1303 of computational 1301.

In some embodiments, RAM 1302 is partitioned to store input data (or data to be processed) 1302$a$ and weight factors 1302$b$. In some embodiments, input data 1302$a$ is stored in a separate memory (e.g., a separate memory die) and weight factors 1302$b$ are stored in a separate memory (e.g., separate memory die).

In some embodiments, computational logic or compute chiplet 1303 comprises matrix multiplier, adder, concatenation logic, buffers, and combinational logic. In various embodiments, compute chiplet 1303 performs multiplication operation on inputs 1302$a$ and weights 1302$b$. In some embodiments, weights 1302$b$ are fixed weights. For example, processor 1305 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes the weights for a training model. Once the weights are computed, they are stored in memory 1302$b$. In various embodiments, the input data, that is to be analyzed using a trained model, is processed by computational block 1301 with computed weights 1302$b$ to generate an output (e.g., a classification result).

In some embodiments, first RAM 1304 is ferroelectric or paraelectric based SRAM. For example, a six transistor (6T) SRAM bit-cells having ferroelectric or paraelectric transistors are used to implement a non-volatile FeSRAM. In some embodiments, SSD 1307 comprises NAND flash cells. In some embodiments, SSD 1307 comprises NOR flash cells. In some embodiments, SSD 1307 comprises multi-threshold NAND flash cells.

In various embodiments, the non-volatility of FeRAM is used to introduce new features such as security, functional safety, and faster reboot time of architecture 1300. The non-volatile FeRAM is a low power RAM that provides fast access to data and weights. FeRAM 1304 can also serve as a fast storage for inference for die 1301 (or accelerator), which typically has low capacity and fast access requirements.

In various embodiments, the FeRAM (FeDRAM or FeSRAM) includes ferroelectric or paraelectric material. The ferroelectric or paraelectric (FE) material may be in a transistor gate stack or in a capacitor of the memory. The ferroelectric material can be any suitable low voltage FE material that allows the FE material to switch its state by a low voltage (e.g., 100 mV). Threshold in the FE material has a highly non-linear transfer function in the polarization vs. voltage response. The threshold is related to: a) non-linearity of switching transfer function, and b) the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in a PbTiO3 P-E (polarization-electric field) square loop can be modified by La or Nb substitution to create an S-shaped loop. The shape can be systematically tuned to ultimately yield a non-linear dielectric. The squareness of the FE switching can also be changed by the granularity of a FE layer. A perfectly epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In some embodiments, the FE material comprises a perovskite of the type $ABO_3$, where 'A' and B' are two cations of different sizes, and 'O' is oxygen which is an anion that bonds to both the cations. Generally, the size of atoms of A is larger than the size of B atoms. In some embodiments, the perovskite can be doped (e.g., by La or lanthanides). In various embodiments, when the FE material is a perovskite, the conductive oxides are of the type AA'BB'$O_3$. A' is a dopant for atomic site A, it can be an element from the lanthanides series. B' is a dopant for atomic site B, it can be an element from the transition metal elements especially Sc, Ti, V, Cr, Mn, Fe, Co, Ni, Cu, or Zn. A' may have the same valency of site A, with a different ferroelectric polarizability.

In some embodiments, the FE material comprises hexagonal ferroelectrics of the type h-RMnO3, where R is a rare earth element which includes one of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides are of A2O3 (e.g., In2O3, Fe2O3) and ABO3 type, where 'A' is a rare earth element and B is Mn.

In some embodiments, the FE material is perovskite, which includes one or more of: La, Sr, Co, Sr, Ru, Y, Ba, Cu, Bi, Ca, and Ni. For example, metallic perovskites such as: $(La,Sr)CoO_3$, $SrRuO_3$, $(La,Sr)MnO_3$, $YBa_2Cu_3O_7$, $Bi_2Sr_2CaCu_2O_8$, $LaNiO_3$, etc. may be used for the FE material. Perovskites can be suitably doped to achieve a spontaneous distortion in a range of 0.3 to 2%. For example, for chemically substituted lead titanate such as Zr in Ti site; La or Nb in Ti site, the concentration of these substitutes is such that it achieves the spontaneous distortion in the range of 0.3-2%. For chemically substituted BiFeO3, BrCrO3, BuCoO3 class of materials, La or rare earth substitution into the Bi site can tune the spontaneous distortion. In some embodiments, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, and LaNiO3.

In some embodiments, the FE material comprises a stack of layers including low voltage FE material between (or sandwiched between) conductive oxides. In various embodiments, when the FE material is a perovskite, the conductive oxides are of the type AA'BB'$O_3$. A' is a dopant for atomic site A, it can be an element from the lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability. In various embodiments, when metallic perovskite is used for the FE material, the conductive oxides can include one or more of: $IrO_2$, $RuO_2$, $PdO_2$, $OsO_2$, or $ReO_3$. In some embodiments, the perovskite is doped with La or lanthanides. In some embodiments, thin layer (e.g., approximately 10 nm) perovskite template conductors such as SrRuO3 coated on top of IrO2, RuO2, PdO2, PtO2, which have a non-perovskite structure but higher conductivity to provide a seed or template for the growth of pure perovskite ferroelectric at low temperatures, are used as the conductive oxides.

In some embodiments, ferroelectric materials are doped with s-orbital material (e.g., materials for first period, second period, and ionic third and fourth periods). In some embodiments, f-orbital materials (e.g., lanthanides) are doped to the ferroelectric material to make paraelectric material. Examples of room temperature paraelectric materials include: SrTiO3, Ba(x)Sr(y)TiO3 (where x is −0.05, and y is 0.95), HfZrO2, Hf—Si—O, La-substituted PbTiO3, PMN-PT based relaxor ferroelectrics.

In some embodiments, the FE material comprises one or more of: hafnium (Hf), zirconium (Zr), aluminum (Al), silicon (Si), their oxides, or their alloyed oxides. In some embodiments, the FE material includes one or more of: Al(1-x)Sc(x)N, Ga(1-x)Sc(x)N, Al(1-x)Y(x)N or Al(1-x-y) Mg(x)Nb(y)N, y doped HfO2, where y includes one of: Al, Ca, Ce, Dy, Er, Gd, Ge, La, Sc, Si, Sr, Sn, or Y, wherein 'x' is a fraction. In some embodiments, the FE material includes one or more of: bismuth ferrite (BFO), lead zirconate titanate (PZT) or BFO with a first doping material, or PZT with a second doping material, wherein the doping material is one of Nb or La; and relaxor ferroelectrics such as PMN-PT.

In some embodiments, the FE material includes bismuth ferrite (BFO) or BFO with a first doping material wherein the first doping material is one of lanthanum, or any element from the lanthanide series of the periodic table. In some embodiments, FE material includes lead zirconium titanate (PZT) or PZT with a second doping material, wherein the doping material is one of La or Nb. In some embodiments, the FE material includes a relaxor ferroelectric, which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), barium titanium-barium strontium titanium (BT-BST).

In some embodiments, the FE material includes hafnium oxides of the form, $Hf(1-x)ExOy$ where E can be Al, Ca, Ce, Dy, Er, Gd, Ge, La, Sc, Si, Sr, Sn, or Y. In some embodiments, the FE material includes niobate type compounds $LiNbO_3$, $LiTaO_3$, lithium iron tantalum oxy fluoride, barium strontium niobate, sodium barium niobate, or potassium strontium niobate.

In some embodiments, the FE material comprises multiple layers. For example, alternating layers of [Bi2O2]2+, and pseudo-perovskite blocks ($Bi_4Ti_3O_{12}$ and related Aurivillius phases), with perovskite layers that are n octahedral layers in thickness can be used. In some embodiments, the FE material comprises organic material. For example, Polyvinylidene fluoride or polyvinylidene difluoride (PVDF).

In some embodiments, the FE material comprises hexagonal ferroelectrics of the type $h$-$RMnO_3$, where R is a rare earth element which includes one of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered $MnO_5$ polyhedra, accompanied by displacements of the Y ions, which lead to a net electric polarization. In some embodiments, hexagonal FE includes one of: $YMnO_3$ or $LuFeO_3$. In various embodiments, when the FE material comprises hexagonal ferroelectrics, the conductive oxides are of $A_2O_3$ (e.g., $In_2O_3$, $Fe_2O_3$) and $ABO_3$ type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are $LuFeO_3$ class of materials or super lattice of ferroelectric and paraelectric materials $PbTiO_3$ (PTO) and $SnTiO_3$ (STO), respectively, and $LaAlO_3$ (LAO) and STO, respectively. For example, a super lattice of [PTO/STO]n or [LAO/STO]n, where 'n' is between 1 and 100. While various embodiments here are described with reference to ferroelectric material for storing the charge state, the embodiments are also applicable for paraelectric material. In some embodiments, paraelectric material includes one of: $SrTiO_3$, $Ba(x)Sr(y)TiO_3$ (where x is −0.5, and y is 0.95), $HfZrO_2$, Hf—Si—O, La-substituted $PbTiO_3$, or PMN-PT based relaxor ferroelectrics.

Figure 14:
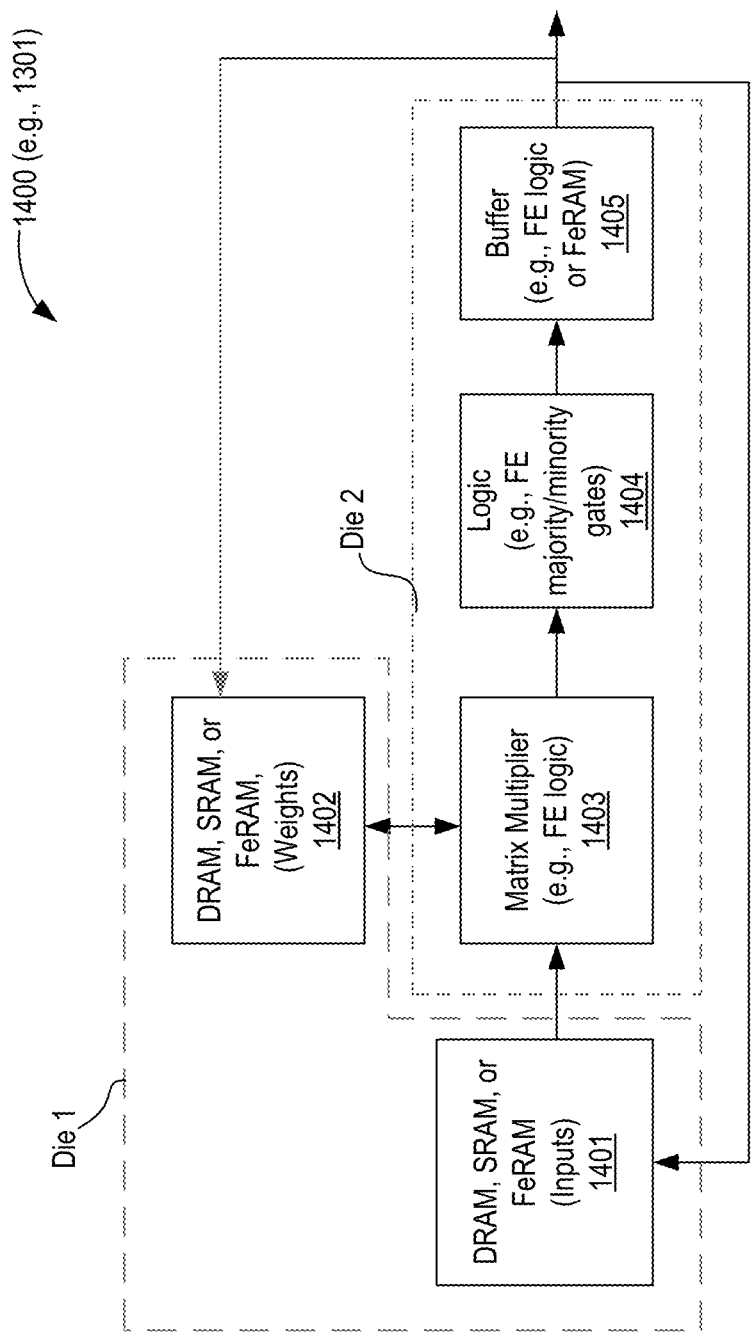
FIG. 14 illustrates an architecture of a computational block comprising a compute die positioned on top of a memory die, wherein the compute die includes one or more adders in accordance with some embodiments.

FIG. 14 illustrates architecture 1400 of a computational block comprising a compute die positioned on top of a memory die, wherein the compute die includes one or more adders in accordance with some embodiments. Any of the blocks here can include the adder of various embodiments. The architecture of FIG. 14 illustrates an architecture for a special purpose compute die where RAM memory buffers for inputs and weights are split on die-1 and logic and optional memory buffers are split on die-2.

In some embodiments, memory die (e.g., Die 1) is positioned below compute die (e.g., Die 2) such that heat sink or thermal solution is adjacent to the compute die. In some embodiments, the memory die is embedded in an interposer. In some embodiments, the memory die behaves as an interposer in addition to its basic memory function. In some embodiments, the memory die is a high bandwidth memory (HBM) which comprises multiple dies of memories in a stack and a controller to control the read and write functions to the stack of memory dies. In some embodiments, the memory die comprises a first die 1401 to store input data and a second die 1402 to store weight factors. In some embodiments, the memory die is a single die that is partitioned such that first partition 1401 of the memory die is used to store input data and second partition 1402 of the memory die is used to store weights. In some embodiments, the memory die comprises DRAM. In some embodiments, the memory die comprises FE-SRAM or FE-DRAM. In some embodiments, the memory die comprises MRAM. In some embodiments, the memory die comprises SRAM. For example, memory partitions 1401 and 1402, or memory dies 1401 and 1402 include one or more of: DRAM, FE-SRAM, FE-DRAM, SRAM, and/or MRAM. In some embodiments, the input data stored in memory partition or die 1401 is the data to be analyzed by a trained model with fixed weights stored in memory partition or die 1402.

In some embodiments, the compute die comprises ferroelectric or paraelectric logic (e.g., majority, minority, and/or threshold gates) to implement matrix multiplier 1403, logic 1404, and temporary buffer 1405. Matrix multiplier 1403 performs multiplication operation on input data 'X' and weights 'W' to generate an output 'Y'. This output may be further processed by logic 1404. In some embodiments, logic 1404 performs: a threshold operation, pooling and drop out operations, and/or concatenation operations to complete the AI logic primitive functions.

In some embodiments, the output of logic 1404 (e.g., processed output 'Y') is temporarily stored in buffer 1405. In some embodiments, buffer 1405 is memory such as one or more of: DRAM, Fe-SRAM, Fe-DRAM, MRAM, resistive RAM (Re-RAM) and/or SRAM. In some embodiments, buffer 1405 is part of the memory die (e.g., Die 1). In some embodiments, buffer 1405 performs the function of a re-timer. In some embodiments, the output of buffer 1405 (e.g., processed output 'Y') is used to modify the weights in memory partition or die 1402. In one such embodiment, computational block 1400 not only operates as an inference circuitry, but also as a training circuitry to train a model. In some embodiments, matrix multiplier 1403 includes an array of multiplier cells, wherein the DRAMs 1401 and 1402 include arrays of memory bit-cells, respectively, wherein each multiplier cell is coupled to a corresponding memory bit-cell of DRAM 1401 and/or DRAM 1402. In some embodiments, computational block 1400 comprises an interconnect fabric coupled to the array of multiplier cells such that each multiplier cell is coupled to the interconnect fabric.

Architecture 1400 provides reduced memory access for the compute die (e.g., die 2) by providing data locality for weights, inputs, and outputs. In one example, data from and to the AI computational blocks (e.g., matrix multiplier 1403) is locally processed within a same packaging unit. Architecture 1400 also segregates the memory and logic operations on to a memory die (e.g., Die 1) and a logic die (e.g., Die 2), respectively, allowing for optimized AI processing. Desegregated dies allow for improved yield of the dies. A high-capacity memory process for Die 1 allows reduction of power of the external interconnects to memory, reduces cost of integration, and results in a smaller footprint.

Figure 15:
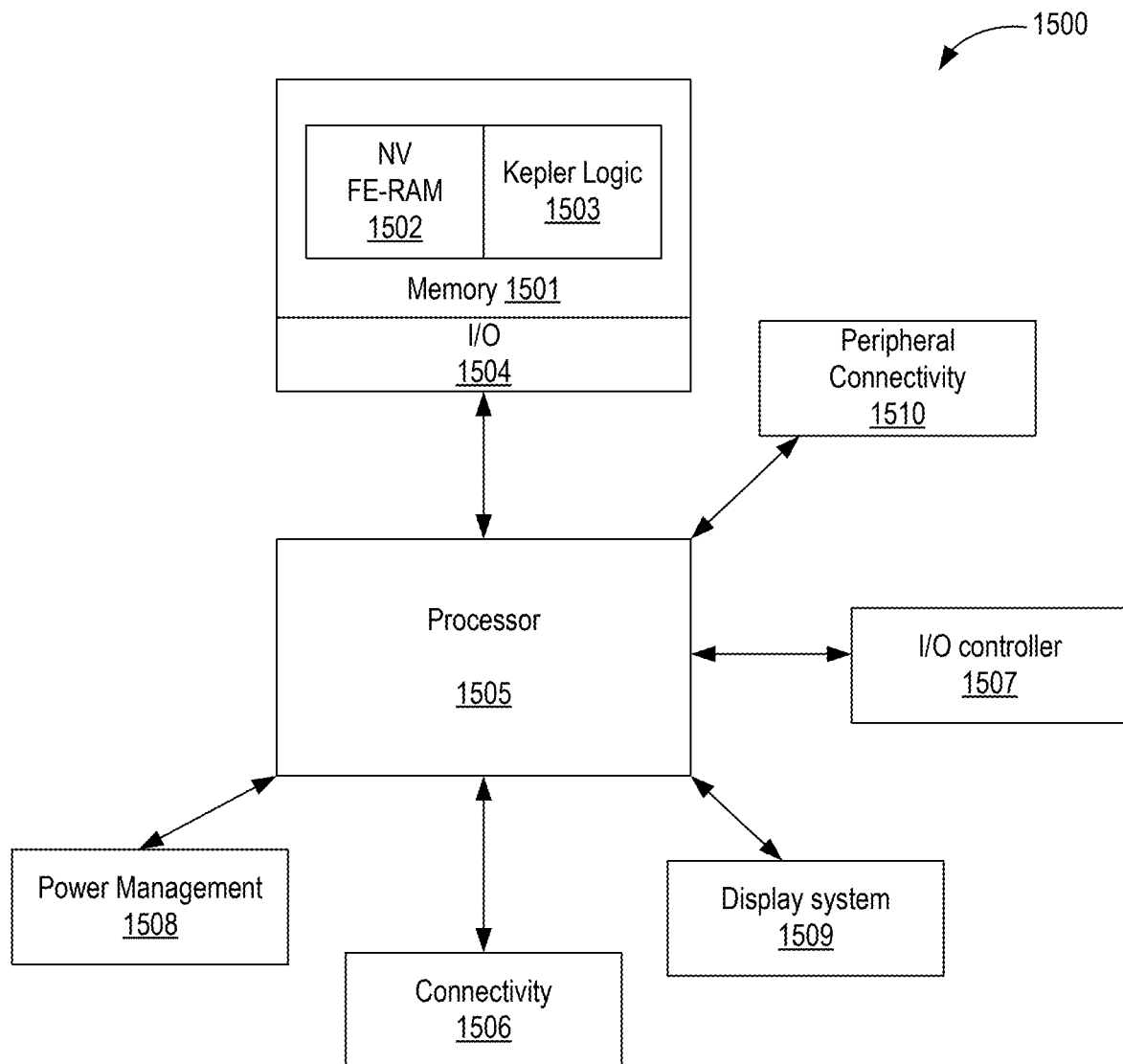
FIG. 15 illustrates a system-on-chip (SOC) that uses ferroelectric or paraelectric based adders, in accordance with some embodiments.

FIG. 15 illustrates system-on-chip (SOC) 1500 that uses ferroelectric or paraelectric based adders, in accordance with some embodiments. Any of the blocks here can include the adder of various embodiments. System-on-chip (SoC) 1500 comprises memory 1501 having static random-access memory (SRAM) or FE based random-access memory FE- RAM, or any other suitable memory. The memory can be non-volatile (NV) or volatile memory. Memory 1501 may also comprise logic 1503 to control memory 1502. For example, write and read drivers are part of logic 1503. These drivers and other logic are implemented using the majority or threshold gates of various embodiments. The logic can comprise majority or threshold gates and traditional logic (e.g., CMOS based NAND, NOR, etc.).

SoC further comprises a memory I/O (input-output) interface 1504. The interface may be double-data rate (DDR) compliant interface or any other suitable interface to communicate with a processor. Processor 1505 of SoC 1500 can be a single core or multiple core processor. Processor 1505 can be a general-purpose processor (CPU), a digital signal processor (DSP), or an Application Specific Integrated Circuit (ASIC) processor. In some embodiments, processor 1505 is an artificial intelligence (AI) processor (e.g., a dedicated AI processor, a graphics processor configured as an AI processor).

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In some embodiments, the AI processor has reduced latency of computing the training model and using the training model, which reduces the power consumption of such AI processor systems.

Processor 1505 may be coupled to a number of other chiplets that can be on the same die as SoC 1500 or on separate dies. These chiplets include connectivity circuitry 1506, I/O controller 1507, power management 1508, and display system 1509, and peripheral connectivity 1506.

Connectivity 1506 represents hardware devices and software components for communicating with other devices. Connectivity 1506 may support various connectivity circuitries and standards. For example, connectivity 1506 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In some embodiments, connectivity 1506 may support non-cellular standards such as WiFi.

I/O controller 1507 represents hardware devices and software components related to interaction with a user. I/O controller 1507 is operable to manage hardware that is part of an audio subsystem and/or display subsystem. For example, input through a microphone or other audio device can provide input or commands for one or more applications or functions of SoC 1500. In some embodiments, I/O controller 1507 illustrates a connection point for additional devices that connect to SoC 1500 through which a user might interact with the system. For example, devices that can be attached to the SoC 1500 might include microphone devices, speaker or stereo systems, video systems or other display devices, keyboard or keypad devices, or other I/O devices for use with specific applications such as card readers or other devices.

Power management 1508 represents hardware or software that perform power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logic. Power management 1508 may accordingly put such logic into low power state without the worry of losing data. Power management may select a power state according to Advanced Configuration and Power Interface (ACPI) specification for one or all components of SoC 1500.

Display system 1509 represents hardware (e.g., display devices) and software (e.g., drivers) components that provide a visual and/or tactile display for a user to interact with the processor 1505. In some embodiments, display system 1509 includes a touch screen (or touch pad) device that provides both output and input to a user. Display system 1509 may include a display interface, which includes the particular screen or hardware device used to provide a display to a user. In some embodiments, the display interface includes logic separate from processor 1505 to perform at least some processing related to the display.

Peripheral connectivity 1510 may represent hardware devices and/or software devices for connecting to peripheral devices such as printers, chargers, cameras, etc. Peripheral connectivity 1510 say support communication protocols, e.g., PCIe (Peripheral Component Interconnect Express), USB (Universal Serial Bus), Thunderbolt, High-Definition Multimedia Interface (HDMI), Firewire, etc.

In various embodiments, SoC 1500 includes coherent cache or memory-side buffer chiplet 1511 which include ferroelectric or paraelectric memory. Coherent cache or memory-side buffer chiplet 1511 can be coupled to processor 1505 and/or memory 1501 according to the various embodiments described herein (e.g., via silicon bridge or vertical stacking).

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

Here, the term "analog signal" generally refers to any continuous signal for which the time varying feature (variable) of the signal is a representation of some other time varying quantity, i.e., analogous to another time varying signal.

Here, the term "digital signal" generally refers to a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art, in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth to describe example embodiments of the disclosure, it should be apparent to one skilled in the art that the disclosure can be practiced without, or with variation of, these specific details. The description is thus to be regarded as illustrative instead of limiting.

The structures of various embodiments described herein can also be described as method of forming those structures, and method of operation of these structures.

Following examples are provided that illustrate the various embodiments. The examples can be combined with other examples. As such, various embodiments can be combined with other embodiments without changing the scope of the invention.

Example 1: An apparatus comprising: a first 3-input majority gate to receive a first input, a second input, and an inverted version of a third input, wherein the first input is a first operand, wherein the second input is a second operand, and wherein the third input is a carry-in bit, wherein the first 3-input majority gate is to generate a first output which is a first majority function of the first input, the second input, and the inverted version of the third input; a second 3-input majority gate to receive the first input, the second input, and the third input, wherein the second 3-input majority gate is to generate a second output which is a second majority function of the first input, the second input, and the third input; and a third 3-input majority gate to receive the first output, an inverted version of the second output, and the third input, wherein the third 3-input majority gate is to generate a third output which is a third majority function of the first output, the inverted version of the second output, and the third input, wherein the first 3-input majority gate, the second 3-input majority gate, and the third 3-input majority gate include non-linear polar material.

Example 2: The apparatus of example 1, wherein the second output is a carry-out.

Example 3: The apparatus of example 1, wherein the third output is a sum.

Example 4: The apparatus of example 1, wherein the first 3-input majority gate comprises: a first capacitor to receive the first input, the first capacitor coupled to a node; a second capacitor to receive the second input, the second capacitor coupled to the node; and a third capacitor to receive the inverted version of the third input, wherein the third capacitor is coupled to the node, wherein the first capacitor, the second capacitor, and the third capacitor include the non-linear polar material.

Example 5: The apparatus of example 1, wherein the non-linear polar material includes one of: ferroelectric material, paraelectric material, or non-linear dielectric.

Example 6: The apparatus of example 5, wherein the ferroelectric material includes one of: bismuth ferrite (BFO) or BFO with a first doping material wherein the first doping material is one of lanthanum or elements from lanthanide series of periodic table; lead zirconium titanate (PZT) or PZT with a second doping material, wherein the second doping material is one of La or Nb; a relaxor ferroelectric which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); a perovskite which includes one of: BaTiO3, PbTiO3, KNbO3, or NaTaO3; a hexagonal ferroelectric which includes one of: YMnO3, or LuFeO3; hexagonal ferroelectrics of a type h-RMnO3, where R is a rare earth element, which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides; hafnium oxides as Hf(1-x) Ex Oy, where E can be Al, Ca, Ce, Dy, Er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, y doped HfO2, where y includes one of: Al, Ca, Ce, Dy, Er, Gd, Ge, La, Sc, Si, Sr, Sn, or Y, wherein 'x' is a fraction; niobate type compounds LiNbO3, LiTaO3, lithium iron tantalum oxy fluoride, barium strontium niobate, sodium barium niobate, or potassium strontium niobate; or improper ferroelectric includes one of: [PTO/STO]n or [LAO/STO]n, where 'n' is between 1 and 100.

Example 7: The apparatus of example 5, wherein the paraelectric material includes: SrTiO3, Ba(x)Sr(y)TiO3 (where x is −0.05, and y is 0.95), HfZrO2, Hf—Si—O, La-substituted PbTiO3, or PMN-PT based relaxor ferroelectrics.

Example 8: An apparatus comprising: a first 3-input minority gate to receive a first input, a second input, and an inverted version of a third input, wherein the first input is a first operand, wherein the second input is a second operand, and wherein the third input is a carry-in bit, wherein the first 3-input minority gate is to generate a first output which is a first minority function of the first input, the second input, and the inverted version of the third input; a second 3-input minority gate to receive the first input, the second input, and the third input, wherein the second 3-input minority gate is to generate a second output which is a second minority function of the first input, the second input, and the third input; and a third 3-input minority gate to receive an inverted version of the first output, the second output, and the third input, wherein the third 3-input minority gate is to generate a third output which is a third minority function of the inverted version of the first output, the second output, and the third input.

Example 9: The apparatus of example 8, wherein an inverted version of the second output is a carry-out, and wherein an inverted version of the third output is a sum.

Example 10: The apparatus of example 8, wherein the first 3-input minority gate, the second 3-input minority gate, and the third 3-input minority gate include non-linear polar material.

Example 11: The apparatus of example 8, wherein the first 3-input minority gate comprises: a first capacitor to receive the first input, the first capacitor coupled to a node; a second capacitor to receive the second input, the second capacitor coupled to the node; a third capacitor to receive the inverted version of the third input, wherein the third capacitor is coupled to the node, wherein the first capacitor, the second capacitor, and the third capacitor include non-linear polar material; and a driver circuitry having a capacitive input coupled to the node, and an output which is to provide minority logic function of the first input, the second input, the inverted version of the third input.

Example 12: The apparatus of example 10, wherein the non-linear polar material includes one of: ferroelectric material, paraelectric material, or non-linear dielectric.

Example 13: The apparatus of example 8 comprises an inverting logic driver to generate the inverted version of the third input from the third input.

Example 14: A system comprising: a processor circuitry to execute one or more instructions; a communication interface communicatively coupled to the processor circuitry; and a memory coupled to the processor circuitry, wherein the processor circuitry comprises an adder circuitry which includes: a first 3-input majority gate to receive a first input, a second input, and an inverted version of a third input, wherein the first input is a first operand, wherein the second input is a second operand, and wherein the third input is a carry-in bit, wherein the first 3-input majority gate is to generate a first output which is a first majority function of the first input, the second input, and the inverted version of the third input; a second 3-input majority gate to receive the first input, the second input, and the third input, wherein the second 3-input majority gate is to generate a second output which is a second majority function of the first input, the second input, and the third input; and a third 3-input majority gate to receive the first output, an inverted version of the second output, and the third input, wherein the third 3-input majority gate is to generate a third output which is a third majority function of the first output, the inverted version of the second output, and the third input, wherein the first 3-input majority gate, the second 3-input majority gate, and the third 3-input majority gate include non-linear polar material.

Example 15: The system of example 14, wherein the second output is a carry-out.

Example 16: The system of example 14, wherein the third output is a sum.

Example 17: The system of example 14, wherein the first 3-input majority gate comprises: a first capacitor to receive the first input, the first capacitor coupled to a node; a second capacitor to receive the second input, the second capacitor coupled to the node; and a third capacitor to receive the inverted version of the third input, wherein the third capacitor is coupled to the node, wherein the first capacitor, the second capacitor, and the third capacitor include non-linear polar material.

Example 18: The system of example 16, wherein the non-linear polar material includes one of: ferroelectric material, paraelectric material, or non-linear dielectric.

Example 19: The system of example 18, wherein the ferroelectric material includes one of: bismuth ferrite (BFO) or BFO with a first doping material wherein the first doping material is one of lanthanum or elements from lanthanide series of periodic table; lead zirconium titanate (PZT) or PZT with a second doping material, wherein the second doping material is one of La or Nb; a relaxor ferroelectric which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); a perovskite which includes one of: BaTiO3, PbTiO3, KNbO3, or NaTaO3; a hexagonal ferroelectric which includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides; hafnium oxides such as Hf(1)-x Ex Oy, where E can be Al, Ca, Ce, Dy, Er, Gd, Ge, La, Sc, Si, Sr, Sn, Zr, or Y; Al(1-x)Sc(x)N, Ga(1-x)Sc(x)N, Al(1-x)Y(x)N or Al(1-x-y) Mg(x)Nb(y)N, y doped HfO2, where y includes one of: Al, Ca, Ce, Dy, Er, Gd, Ge, La, Sc, Si, Sr, Sn, or Y, wherein 'x' is a fraction; niobate type compounds LiNbO3, LiTaO3, lithium iron tantalum oxy fluoride, barium strontium niobate, sodium barium niobate, or potassium strontium niobate; or an improper ferroelectric which includes one of: [PTO/STO]n or [LAO/STO]n, where 'n' is between 1 and 100.

Example 20: The system of example 18, wherein the paraelectric material includes: SrTiO3, Ba(x)Sr(y)TiO3 (where x is −0.05, and y is 0.95), HfZrO2, Hf—Si—O, La-substituted PbTiO3, or PMN-PT based relaxor ferroelectrics.

Example 1a: An apparatus comprising: a 3-input majority gate to receive a first input, a second input, and a third input, wherein the first input is a first operand, wherein the second input is a second operand, and wherein the third input is a carry-in bit; and a 5-input majority gate to receive the first input, the second input, the third input, and two times an inverted output of the 3-input majority gate, wherein the 3-input majority gate and the 5-input majority gate include non-linear polar material.

Example 2a: The apparatus of example 1a comprising an inverter coupled to an output of the 3-input majority gate.

Example 3a: The apparatus of example 2a, wherein an output of the inverter is coupled to two inputs of the 5-input majority gate.

Example 4a: The apparatus of example 1a, wherein an output of the 3-input majority gate is a carry-out.

Example 5a: The apparatus of example 1a, wherein an output of the 5-input majority gate is a sum.

Example 6a: The apparatus of example 1a, wherein the 3-input majority gate comprises: a first capacitor to receive the first input, the first capacitor coupled to a node; a second capacitor to receive the second input, the second capacitor coupled to the node; and a third capacitor to receive the third input, wherein the third capacitor is coupled to the node, wherein the first capacitor, the second capacitor, and the third capacitor include non-linear polar material.

Example 7a: The apparatus of example 1a, wherein the 5-input majority gate comprises: a first capacitor to receive the first input, the first capacitor coupled to a node; a second capacitor to receive the second input, the second capacitor coupled to the node; a third capacitor to receive the third input, wherein the third capacitor is coupled to the node; a fourth capacitor to receive the inverted output of the 3-input majority gate, wherein the fourth capacitor is coupled to the node; and a fifth capacitor to receive the inverted output of the 3-input majority gate, wherein the fifth capacitor is coupled to the node, wherein the first capacitor, the second capacitor, the third capacitor, the fourth capacitor, and the fifth capacitor include non-linear polar material.

Example 8a: The apparatus of example 1a, wherein the non-linear polar material includes one of: a ferroelectric material, a paraelectric material, or a non-linear dielectric.

Example 9a: The apparatus of example 8a, wherein the ferroelectric material includes one of: bismuth ferrite (BFO) or BFO with a first doping material wherein the first doping material is one of lanthanum, or elements from lanthanide series of periodic table; lead zirconium titanate (PZT) or PZT with a second doping material, wherein the second doping material is one of La or Nb; a relaxor ferroelectric which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); a perovskite which includes one of: BaTiO3, PbTiO3, KNbO3, or NaTaO3; a hexagonal ferroelectric which includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides; hafnium oxides as Hf1-x Ex Oy, where E can be Al, Ca, Ce, Dy, Er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, y doped HfO2, where y includes one of: Al, Ca, Ce, Dy, Er, Gd, Ge, La, Sc, Si, Sr, Sn, or Y, wherein 'x' is a fraction; niobate type compounds LiNbO3, LiTaO3, lithium iron tantalum oxy fluoride, barium strontium niobate, sodium barium niobate, or potassium strontium niobate; or an improper ferroelectric which includes one of: [PTO/STO]n or [LAO/STO]n, where 'n' is between 1 and 100.

Example 10a: The apparatus of example 8a, wherein the paraelectric material includes: SrTiO3, Ba(x)Sr(y)TiO3 (where x is −0.05, and y is 0.95), HfZrO2, Hf—Si—O, La-substituted PbTiO3, or PMN-PT based relaxor ferroelectrics.

Example 11a: An apparatus comprising: a 3-input minority gate to receive a first input, a second input, and a third input, wherein the first input is a first operand, wherein the second input is a second operand, and wherein the third input is a carry-in bit; and a 5-input minority gate to receive the first input, the second input, the third input, and two times an output of the 3-input minority gate.

Example 12a: The apparatus of example 11a comprising an inverter coupled to an output of the 3-input minority gate.

Example 13a: The apparatus of example 12a, wherein an output of the inverter is a carry-out, and wherein an output of the 5-input minority gate is a sum.

Example 14a: The apparatus of example 11a, wherein the 3-input minority gate and the 5-input minority gate include non-linear polar material.

Example 15a: The apparatus of example 12a, wherein the inverter is a first inverter, wherein the 3-input minority gate comprises: a first capacitor to receive the first input, the first capacitor coupled to a node; a second capacitor to receive the second input, the second capacitor coupled to the node; a third capacitor to receive the third input, wherein the third capacitor is coupled to the node; and a second inverter coupled to the node, wherein the first capacitor, the second capacitor, and the third capacitor include non-linear polar material.

Example 16a: The apparatus of example 11a, wherein the 5-input minority gate comprises: a first capacitor to receive the first input, the first capacitor coupled to a node; a second capacitor to receive the second input, the second capacitor coupled to the node; a third capacitor to receive the third input, wherein the third capacitor is coupled to the node; a fourth capacitor to receive the output of the 3-input minority gate, wherein the fourth capacitor is coupled to the node; a fifth capacitor to receive the output of the 3-input minority gate, wherein the fifth capacitor is coupled to the node; and a third inverter coupled to the node, wherein the first capacitor, the second capacitor, the third capacitor, the fourth capacitor, and the fifth capacitor include non-linear polar material.

Example 17a: The apparatus of example 16a, wherein the non-linear polar material includes one of: a ferroelectric material, a paraelectric material, or a non-linear dielectric.

Example 18a: A system comprising: a processor circuitry to execute one or more instructions; a communication interface communicatively coupled to the processor circuitry; and a memory coupled to the processor circuitry, wherein the processor circuitry comprises an adder circuitry which includes: a 3-input majority gate to receive a first input, a second input, and a third input, wherein the first input is a first operand, wherein the second input is a second operand, and wherein the third input is a carry-in bit; and a 5-input majority gate to receive the first input, the second input, the third input, and two times an inverted output of the 3-input majority gate, wherein the 3-input majority gate and the 5-input majority gate include non-linear polar material.

Example 19a: The system of example 18a, wherein the adder circuitry comprises an inverter coupled to an output of the 3-input majority gate.

Example 20a: The system of example 19a, wherein an output of the inverter is coupled to two inputs of the 5-input majority gate, wherein an output of the 3-input majority gate is a carry-out.

Example 1b: An apparatus comprising: a first 1-bit adder to receive a first input, a second input, and a third input, wherein the first input is a first operand, wherein the second input is a second operand, and wherein the third input is a carry-in input, wherein the third input is coupled to ground, wherein the first 1-bit adder is to generate a first sum output and a first carry output; and a second 1-bit adder coupled to the first 1-bit adder, wherein the second 1-bit adder is to receive a fourth input, a fifth input, and a sixth input, wherein the fourth input is a third operand, wherein the fifth input is a fourth operand, and wherein the sixth input is a carry-in input, wherein the sixth input is coupled to the first sum output, wherein the second 1-bit adder is to generate a second sum output and a second carry output, wherein the first 1-bit adder and the second 1-bit adder include input capacitors with non-linear polar material.

Example 2b: The apparatus of example 1b, wherein the first 1-bit adder comprises: a 3-input majority gate to receive the first input, the second input, and the third input; and a 5-input majority gate to receive the first input, the second input, the third input, and two times an inverted output of the 3-input majority gate.

Example 3b: The apparatus of example 2b comprising an inverter coupled to an output of the 3-input majority gate.

Example 4b: The apparatus of example 3b, wherein an output of the inverter is coupled to two inputs of the 5-input majority gate.

Example 5b: The apparatus of example 2b, wherein an output of the 3-input majority gate is the first carry output, and wherein an output of the 5-input majority gate is the first sum output.

Example 6b: The apparatus of example 2b, wherein the 3-input majority gate and the 5-input majority gate include the non-linear polar material.

Example 7b: The apparatus of example 2b, wherein the 3-input majority gate comprises: a first capacitor to receive the first input, the first capacitor coupled to a node; a second capacitor to receive the second input, the second capacitor coupled to the node; and a third capacitor to receive the third input, wherein the third capacitor is coupled to the node, wherein the first capacitor, the second capacitor, and the third capacitor include the non-linear polar material.

Example 8b: The apparatus of example 2b, wherein the 5-input majority gate comprises: a first capacitor to receive the first input, the first capacitor coupled to a node; a second capacitor to receive the second input, the second capacitor coupled to the node; a third capacitor to receive the third input, wherein the third capacitor is coupled to the node; a fourth capacitor to receive the inverted output of the 3-input majority gate, wherein the fourth capacitor is coupled to the node; and a fifth capacitor to receive the inverted output of the 3-input majority gate, wherein the fifth capacitor is coupled to the node, wherein the first capacitor, the second capacitor, the third capacitor, the fourth capacitor, and the fifth capacitor include then non-linear polar material.

Example 9b: The apparatus of example 1b, wherein the non-linear polar material includes one of: ferroelectric material, paraelectric material, or non-linear dielectric.

Example 10b: The apparatus of claim 9b, wherein the ferroelectric material includes one of: bismuth ferrite (BFO) or BFO with a first doping material wherein the first doping material is one of lanthanum, or elements from lanthanide series of periodic table; lead zirconium titanate (PZT) or PZT with a second doping material, wherein the second doping material is one of La or Nb; a relaxor ferroelectric which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); a perovskite which includes one of: BaTiO3, PbTiO3, KNbO3, or NaTaO3; hexagonal ferroelectric includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides; hafnium oxides as Hf(1-x) Ex Oy, where E can be Al, Ca, Ce, Dy, Er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, y doped HfO2, where u includes one of: Al, Ca, Ce, Dy, Er, Gd, Ge, La, Sc, Si, Sr, Sn, or Y, wherein 'x' is a fraction; niobate type compounds LiNbO3, LiTaO3, lithium iron tantalum oxy fluoride, barium strontium niobate, sodium barium niobate, or potassium strontium niobate; or an improper ferroelectric which includes one of: [PTO/STO]n or [LAO/STO]n, where 'n' is between 1 and 100.

Example 11b: The apparatus of example 9b, wherein the paraelectric material includes: SrTiO3, Ba(x)Sr(y)TiO3 (where x is −0.05, and y is 0.95), HfZrO2, Hf—Si—O, La-substituted PbTiO3, or PMN-PT based relaxor ferroelectrics.

Example 12b: An apparatus comprising: a first set of sequential circuits to receive a first set of unsampled inputs and to generate a first set of sampled outputs; and a ripple carry adder coupled to the first set of sequential circuits, wherein the ripple carry adder is to receive the first set of sampled outputs, wherein the ripple carry adder includes a plurality of 1-bit adders, wherein an individual 1-bit adder of the plurality of 1-bit adders includes input capacitors with non-linear polar material.

Example 13b: The apparatus of example 12b comprising a second set of sequential circuits to receive a second set of unsampled inputs and to generate a second set of sampled outputs, wherein the second set of unsampled inputs are a set of sum outputs from the ripple carry adder.

Example 14b: The apparatus of example 13b, wherein the first set of sampled outputs includes a first input, a second input, and a third input, wherein the ripple carry adder comprises: a first 1-bit adder to receive the first input, the second input, and the third input, wherein the first input is a first operand, wherein the second input is a second operand, and wherein the third input is a carry-in input, wherein the third input is coupled to ground, wherein the first 1-bit adder is to generate a first sum output and a first carry output, wherein the first sum output is part of the second set of unsampled inputs.

Example 15b: The apparatus of example 14b, wherein the first set of sampled outputs includes a fourth input, a fifth input, and a sixth input, wherein the ripple carry adder comprises: a second 1-bit adder coupled to the first 1-bit adder, wherein the second 1-bit adder is to receive the fourth input, the fifth input, and the sixth input, wherein the fourth input is a third operand, wherein the fifth input is a fourth operand, and wherein the sixth input is a carry-in input, wherein the sixth input is coupled to the first sum output, wherein the second 1-bit adder is to generate a second sum output and a second carry output, wherein the first 1-bit adder and the second 1-bit adder include input capacitors with non-linear polar material, wherein the second sum output is part of the second set of unsampled inputs.

Example 16b: The apparatus of example 12b, wherein the non-linear polar material includes one of: ferroelectric material, paraelectric material, or non-linear dielectric.

Example 17b: A system comprising: a processor circuitry to execute one or more instructions; a communication interface communicatively coupled to the processor circuitry; and a memory coupled to the processor circuitry, wherein the processor circuitry comprises an adder circuitry which includes: a first 1-bit adder to receive a first input, a second input, and a third input, wherein the first input is a first operand, wherein the second input is a second operand, and wherein the third input is a carry-in input, wherein the third input is coupled to ground, wherein the first 1-bit adder is to generate a first sum output and a first carry output; and a second 1-bit adder coupled to the first 1-bit adder, wherein the second 1-bit adder is to receive a fourth input, a fifth input, and a sixth input, wherein the fourth input is a third operand, wherein the fifth input is a fourth operand, and wherein the sixth input is a carry-in input, wherein the sixth input is coupled to the first sum output, wherein the second 1-bit adder is to generate a second sum output and a second carry output, wherein the first 1-bit adder and the second 1-bit adder include input capacitors with non-linear polar material.

Example 18b: The system of example 17b, the first 1-bit adder comprises: a 3-input majority gate to receive the first input, the second input, and the third input; and a 5-input majority gate to receive the first input, the second input, the third input, and two times an inverted output of the 3-input majority gate.

Example 19b: The system of example 18b, wherein the 3-input majority gate comprises: a first capacitor to receive the first input, the first capacitor coupled to a node; a second capacitor to receive the second input, the second capacitor coupled to the node; and a third capacitor to receive the third input, wherein the third capacitor is coupled to the node, wherein the first capacitor, the second capacitor, and the third capacitor include non-linear polar material.

Example 20b: The system of example 17b, wherein the non-linear polar material includes one of: ferroelectric material, paraelectric material, or non-linear dielectric.

Example 1c: An apparatus comprising: a first 1-bit adder to receive a first input, a second input, and a third input, wherein the first input is a first operand, wherein the second input is a second operand, and wherein the third input is a first carry-in input, wherein in the first 1-bit adder is to generate a first sum output and a first carry output; a second 1-bit adder to receive a fourth input, a fifth input, and a sixth input, wherein the fourth input is a third operand, wherein the fifth input is a fourth operand, and wherein the sixth input is a second carry-in input, wherein in the second 1-bit adder is to generate a second sum output and a second carry output; and a ripple carry adder coupled to the first 1-bit adder and the second 1-bit adder, wherein the ripple carry adder receives the first carry output, the second sum output, and the second carry output, wherein the first 1-bit adder and the second 1-bit adder comprise capacitors with non-linear polar material.

Example 2c: The apparatus of example 1c, wherein the ripple carry adder comprises: a first 1-bit full-adder to receive a seventh input, an eighth input, a ninth input, wherein the seventh input is a first operand which is coupled to the first carry output, wherein the eighth input is a second operand which is coupled to the second sum output, wherein the ninth input is a carry-in input which is coupled to a ground, wherein the first 1-bit full-adder is to generate a first ripple sum output and a first ripple carry output.

Example 3c: The apparatus of example 2c, wherein the ripple carry adder comprises: a second 1-bit full-adder to receive a tenth input, an eleventh input, a twelfth input, wherein the tenth input is a first operand which is coupled to the second carry output, wherein the eleventh input is a second operand which is coupled to a third sum output, wherein the twelfth input is a carry-in input which is coupled to the first ripple carry output, wherein the second 1-bit full-adder is to generate a second ripple sum output and a second ripple carry output.

Example 4c: The apparatus of example 3c, wherein the third sum output is generated by a third 1-bit adder coupled to the ripple carry adder.

Example 5c: The apparatus of example 2c, wherein the first 1-bit full-adder includes: a first input capacitor coupled to the seventh input, a second input capacitor coupled to the eighth input, and a third input capacitor coupled to the ninth input, wherein the first input capacitor, the second input capacitor, and the third input capacitor include non-linear polar material.

Example 6c: The apparatus of example 1c, the first 1-bit adder comprises: a 3-input majority gate to receive the first input, the second input, and the third input; and a 5-input majority gate to receive the first input, the second input, the third input, and two times an inverted output of the 3-input majority gate.

Example 7c: The apparatus of example 6c comprising an inverter coupled to an output of the 3-input majority gate.

Example 8c: The apparatus of example 7c, wherein an output of the inverter is coupled to two inputs of the 5-input majority gate.

Example 9c: The apparatus of example 6c, wherein an output of the 3-input majority gate is the first carry output, and wherein an output of the 5-input majority gate is the first sum output.

Example 10c: The apparatus of example 6c, wherein the 3-input majority gate and the 5-input majority gate include the non-linear polar material.

Example 11c: The apparatus of example 6c, wherein the 3-input majority gate comprises: a first capacitor to receive the first input, the first capacitor coupled to a node; a second capacitor to receive the second input, the second capacitor coupled to the node; and a third capacitor to receive the third input, wherein the third capacitor is coupled to the node, wherein the first capacitor, the second capacitor, and the third capacitor include non-linear polar material.

Example 12c: The apparatus of example 6c, wherein the 5-input majority gate comprises: a first capacitor to receive the first input, the first capacitor coupled to a node; a second capacitor to receive the second input, the second capacitor coupled to the node; a third capacitor to receive the third input, wherein the third capacitor is coupled to the node; a fourth capacitor to receive the inverted output of the 3-input majority gate, wherein the fourth capacitor is coupled to the node; and a fifth capacitor to receive the inverted output of the 3-input majority gate, wherein the fifth capacitor is coupled to the node, wherein the first capacitor, the second capacitor, the third capacitor, the fourth capacitor, and the fifth capacitor include non-linear polar material.

Example 13c: The apparatus of example 1c, wherein the non-linear polar material includes one of: ferroelectric material, paraelectric material, or non-linear dielectric.

Example 14c: The apparatus of example 13c, wherein the ferroelectric material includes one of: bismuth ferrite (BFO) or BFO with a first doping material wherein the first doping material is one of lanthanum or elements from lanthanide series of periodic table; lead zirconium titanate (PZT) or PZT with a second doping material, wherein the second doping material is one of La or Nb; a relaxor ferroelectric which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); a perovskite which includes one of: BaTiO3, PbTiO3, KNbO3, or NaTaO3; a hexagonal ferroelectric which includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides; hafnium oxides as Hf(1-x) Ex Oy, where E can be Al, Ca, Ce, Dy, Er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, y doped HfO2, where y includes one of: Al, Ca, Ce, Dy, Er, Gd, Ge, La, Sc, Si, Sr, Sn, or Y, wherein 'x' is a fraction; niobate type compounds LiNbO3, LiTaO3, lithium iron tantalum oxy fluoride, barium strontium niobate, sodium barium niobate, or potassium strontium niobate; or an improper ferroelectric which includes one of: [PTO/STO]n or [LAO/STO]n, where 'n' is between 1 and 100.

Example 15c: The apparatus of example 13c, wherein the paraelectric material includes: SrTiO3, Ba(x)Sr(y)TiO3 (where x is −0.05, and y is 0.95), HfZrO2, Hf—Si—O, La-substituted PbTiO3, or PMN-PT based relaxor ferroelectrics.

Example 16c: An apparatus comprising: a first set of sequential circuits to receive a first set of unsampled inputs and to generate a first set of sampled outputs; and a carry save adder coupled to the first set of sequential circuits, wherein the carry save adder is to receive some of the first set of sampled outputs, wherein the carry save adder includes a plurality of 1-bit adders, wherein an individual 1-bit adder of the plurality of 1-bit adders includes input capacitors with non-linear polar material.

Example 17c: The apparatus of example 16c comprising a second set of sequential circuits to receive a second set of unsampled inputs and to generate a second set of sampled outputs, wherein some of the second set of unsampled inputs are a set of sum outputs from the carry save adder.

Example 18c: The apparatus of example 16c, wherein the non-linear polar material includes one of: ferroelectric material, paraelectric material, or non-linear dielectric.

Example 19c: The apparatus of example 16c, wherein the carry save adder comprises: a first 1-bit adder to receive a first input, a second input, and a third input, wherein the first input is a first operand, wherein the second input is a second operand, and wherein the third input is a first carry-in input, wherein in the first 1-bit adder is to generate a first sum output and a first carry output; a second 1-bit adder to receive a fourth input, a fifth input, and a sixth input, wherein the fourth input is a third operand, wherein the fifth input is a fourth operand, and wherein the sixth input is a second carry-in input, wherein in the second 1-bit adder is to generate a second sum output and a second carry output; and a ripple carry adder coupled to the first 1-bit adder and the second 1-bit adder, wherein the ripple carry adder receives the first carry output, the second sum output, and the second carry output, wherein the first 1-bit adder and the second 1-bit adder comprise capacitors with non-linear polar material.

Example 20c: A system comprising: a processor circuitry to execute one or more instructions; a communication interface communicatively coupled to the processor circuitry; and a memory coupled to the processor circuitry, wherein the processor circuitry comprises a carry save adder circuitry which includes: a first 1-bit adder to receive a first input, a second input, and a third input, wherein the first input is a first operand, wherein the second input is a second operand, and wherein the third input is a first carry-in input, wherein in the first 1-bit adder is to generate a first sum output and a first carry output; a second 1-bit adder to receive a fourth input, a fifth input, and a sixth input, wherein the fourth input is a third operand, wherein the fifth input is a fourth operand, and wherein the sixth input is a second carry-in input, wherein in the second 1-bit adder is to generate a second sum output and a second carry output; and a ripple carry adder coupled to the first 1-bit adder and the second 1-bit adder, wherein the ripple carry adder receives the first carry output, the second sum output, and the second carry output, wherein the first 1-bit adder and the second 1-bit adder comprise capacitors with non-linear polar material.

Example 1d: An apparatus comprising: a first 1-bit adder to receive a first input, a second input, and a third input, wherein the first input is a first operand, wherein the second input is a second operand, wherein the third input is a carry-in input, wherein the third input is coupled to ground, and wherein the first 1-bit adder is to generate a first inverted sum output and a first inverted carry output; and a second 1-bit adder coupled to the first 1-bit adder, wherein the second 1-bit adder is to receive a fourth input, a fifth input, and a sixth input, wherein the fourth input is a third operand, wherein the fifth input is a fourth operand, and wherein the sixth input is an inverted carry-in input, wherein the sixth input is coupled to the first inverted carry output, wherein the second 1-bit adder is to generate a second sum output and a second carry output, wherein the first 1-bit adder and the second 1-bit adder include input capacitors with non-linear polar material.

Example 2d: The apparatus of example 1d comprises a first inverter to generate the third operand for the fourth input, and a second inverter to generate the fourth operand for the fifth input.

Example 3d: The apparatus of example 1d comprises a third inverter to invert the first inverted sum output to generate a first sum output.

Example 4d: The apparatus of example 1d, wherein the sixth input is either directly coupled to the first inverted carry output or receives a buffered version of the first inverted carry output.

Example 5d: The apparatus of example 1d, wherein the first 1-bit adder comprises: a 3-input minority gate to receive the first input, the second input, and the third input; and a 5-input minority gate to receive the first input, the second input, the third input, and two times an output of the 3-input minority gate, wherein the 3-input minority gate and the 5-input minority gate include the non-linear polar material.

Example 6d: The apparatus of example 5d, wherein an output of the 3-input minority gate is the first inverted carry output, and wherein an output of the 5-input minority gate is the first inverted sum output.

Example 7d: The apparatus of example 5d, wherein the 3-input minority gate comprises: a first capacitor to receive the first input, the first capacitor coupled to a node; a second capacitor to receive the second input, the second capacitor coupled to the node; and a third capacitor to receive the third input, wherein the third capacitor is coupled to the node, wherein the first capacitor, the second capacitor, and the third capacitor include the non-linear polar material.

Example 8d: The apparatus of example 5d, wherein the 5-input minority gate comprises: a first capacitor to receive the first input, the first capacitor coupled to a node; a second capacitor to receive the second input, the second capacitor coupled to the node; a third capacitor to receive the third input, wherein the third capacitor is coupled to the node; a fourth capacitor to receive the output of the 3-input minority gate, wherein the fourth capacitor is coupled to the node; and a fifth capacitor to receive the output of the 3-input minority gate, wherein the fifth capacitor is coupled to the node, wherein the first capacitor, the second capacitor, the third capacitor, the fourth capacitor, and the fifth capacitor include the non-linear polar material.

Example 9d: The apparatus of example 1d, the second 1-bit adder comprises: a 3-input minority gate to receive the fourth input, the fifth input, and the sixth input, wherein the fourth input receives an inverted fourth input, wherein the fifth input receives an inverted fifth input, and wherein sixth input is an inverted sixth input; and a 5-input minority gate to receive the fourth input, the fifth input, the sixth input, and two times an output of the 3-input minority gate, wherein the 3-input minority gate and the 5-input minority gate include non-linear polar material.

Example 10d: The apparatus of example 1d, wherein the non-linear polar material includes one of: ferroelectric material, paraelectric material, or non-linear dielectric.

Example 11d: The apparatus of claim 10d, wherein the ferroelectric material includes one of: bismuth ferrite (BFO) or BFO with a first doping material wherein the first doping material is one of lanthanum or elements from lanthanide series of periodic table; lead zirconium titanate (PZT) or PZT with a second doping material, wherein the second doping material is one of La or Nb; a relaxor ferroelectric which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); a perovskite which includes one of: BaTiO3, PbTiO3, KNbO3, or NaTaO3; a hexagonal ferroelectric which includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides; hafnium oxides as Hf(1-x) Ex Oy, where E can be Al, Ca, Ce, Dy, Er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, y doped HfO2, where y includes one of: Al, Ca, Ce, Dy, Er, Gd, Ge, La, Sc, Si, Sr, Sn, or Y, wherein 'x' is a fraction; niobate type compounds LiNbO3, LiTaO3, lithium iron tantalum oxy fluoride, barium strontium niobate, sodium barium niobate, or potassium strontium niobate; or an improper ferroelectric which includes one of: [PTO/STO]n or [LAO/STO]n, where 'n' is between 1 and 100.

Example 12d: The apparatus of example 10d, wherein the paraelectric material includes: SrTiO3, Ba(x)Sr(y)TiO3 (where x is −0.05, and y is 0.95), HfZrO2, Hf—Si—O, La-substituted PbTiO3, or PMN-PT based relaxor ferroelectrics.

Example 13d: An apparatus comprising: a ripple carry adder comprising alternating adders, wherein the alternating adders include: a first 1-bit adder with inverted carry output and inverted sum output, and a second 1-bit adder with inverted carry input and inverted operands, wherein the inverted carry output is coupled to the inverted carry input; and an inverter coupled to the inverted sum output of the first 1-bit adder, wherein the alternating adders include majority or minority gates.

Example 14d: The apparatus of example 13d, wherein the first 1-bit adder and the second 1-bit adder include non-linear polar material.

Example 15d: The apparatus of example 13d, wherein the first 1-bit adder comprises: a 3-input minority gate to receive a first input, a second input, and a third input; and a 5-input minority gate to receive the first input, the second input, the third input, and two times an output of the 3-input minority gate, wherein the 3-input minority gate and the 5-input minority gate include non-linear polar material.

Example 16d: The apparatus of example 13d, wherein the second 1-bit adder comprises: a 3-input minority gate to receive a fourth input, a fifth input, and a sixth input, wherein the fourth input receives an inverted fourth input, wherein the fifth input receives an inverted fifth input, and wherein sixth input is the inverted carry output from the first 1-bit adder; and a 5-input minority gate to receive the fourth input, the fifth input, the sixth input, and two times an output of the 3-input minority gate, wherein the 3-input minority gate and the 5-input minority gate include non-linear polar material.

Example 17d: A system comprising: a processor circuitry to execute one or more instructions; a communication interface communicatively coupled to the processor circuitry; and a memory coupled to the processor circuitry, wherein the processor circuitry includes: a ripple carry adder comprising alternating adders, wherein the alternating adders include: a first 1-bit adder with inverted carry output and inverted sum output, and a second 1-bit adder with inverted carry input and inverted operands, wherein the inverted carry output is coupled to the inverted carry input, wherein the alternating adders include majority or minority gates; and an inverter coupled to the inverted sum output of the first 1-bit adder.

Example 18d: The system of example 17d, wherein the first 1-bit adder and the second 1-bit adder include non-linear polar material.

Example 19d: The system of example 17d, wherein the first 1-bit adder comprises: a 3-input minority gate to receive a first input, a second input, and a third input; and a 5-input minority gate to receive the first input, the second input, the third input, and two times an output of the 3-input minority gate, wherein the 3-input minority gate and the 5-input minority gate include non-linear polar material.

Example 20d: The system of example 17d, wherein the second 1-bit adder comprises: a 3-input minority gate to receive a fourth input, a fifth input, and a sixth input, wherein the fourth input receives an inverted fourth input, wherein the fifth input receives an inverted fifth input, and wherein sixth input is the inverted carry output from the first 1-bit adder; and a 5-input minority gate to receive the fourth input, the fifth input, the sixth input, and two times an output of the 3-input minority gate, wherein the 3-input minority gate and the 5-input minority gate include non-linear polar material.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:
1. An apparatus comprising:
a 3-input majority gate to receive a first input, a second input, and a third input, wherein the first input is a first operand, wherein the second input is a second operand, and wherein the third input is a carry-in bit; and
a 5-input majority gate to receive the first input, the second input, the third input, and two times an inverted output of the 3-input majority gate, wherein the 3-input majority gate and the 5-input majority gate include a non-linear polar material, and wherein the 3-input majority gate comprises:

a first capacitor to receive the first input, the first capacitor coupled to a node;

a second capacitor to receive the second input, the second capacitor coupled to the node; and a third capacitor to receive the third input, wherein the third capacitor is coupled to the node, wherein the first capacitor, the second capacitor, and the third capacitor include the non-linear polar material.

2. The apparatus of claim 1 comprising an inverter coupled to an output of the 3-input majority gate.

3. The apparatus of claim 2, wherein an output of the inverter is coupled to two inputs of the 5-input majority gate.

4. The apparatus of claim 1, wherein an output of the 3-input majority gate is a carry-out.

5. The apparatus of claim 1, wherein an output of the 5-input majority gate is a sum.

6. The apparatus of claim 1, wherein the 5-input majority gate comprises:

a first capacitor to receive the first input, the first capacitor coupled to a node;

a second capacitor to receive the second input, the second capacitor coupled to the node;

a third capacitor to receive the third input, wherein the third capacitor is coupled to the node;

a fourth capacitor to receive the inverted output of the 3-input majority gate, wherein the fourth capacitor is coupled to the node; and a fifth capacitor to receive the inverted output of the 3-input majority gate, wherein the fifth capacitor is coupled to the node, and wherein the first capacitor, the second capacitor, the third capacitor, the fourth capacitor, and the fifth capacitor include the non-linear polar material.

7. The apparatus of claim 1, wherein the non-linear polar material includes one of: ferroelectric material, paraelectric material, or non-linear dielectric.

8. The apparatus of claim 7, wherein the ferroelectric material includes one of:

bismuth ferrite (BFO) or BFO with a first doping material: wherein the first doping material is one of lanthanum or elements from lanthanide series of periodic table;

lead zirconium titanate (PZT) or PZT with a second doping material, wherein the second doping material is one of La or Nb;

a relaxor ferroelectric which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST);

a perovskite which includes one of: BaTiO3, PbTiO$_3$, KNbO$_3$, or NaTaO$_3$;

a hexagonal ferroelectric which includes one of: YMnO$_3$, or LuFeO$_3$;

hexagonal ferroelectrics of a type h-RMnO$_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);

hafnium (Hf), zirconium (Zr), aluminum (Al), silicon (Si), their oxides, or their alloyed oxides;

hafnium oxides as $Hf_{(1-x)}E_xO_y$, where E is one of Al, Ca, Ce, Dy, Er, Gd, Ge, La, Sc, Si, Sr, Sn, Zr, or Y, wherein x and y are first and second fractions, respectively;

$Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, wherein x and y are third and fourth fractions, respectively;

y doped HfO$_2$, where y includes one of: Al, Ca, Ce, Dy, Er, Gd, Ge, La, Sc, Si, Sr, Sn, or Y;

niobate type compounds LiNbO$_3$, LiTaO$_3$, lithium iron tantalum oxy fluoride, barium strontium niobate, sodium barium niobate, or potassium strontium niobate; or an improper ferroelectric which includes one of: [PTO/STO]n or [LAO/STO]n, where 'n' is between 1 and 100.

9. The apparatus of claim 7, wherein the paraelectric material includes: SrTiO$_3$, $Ba_{(x)}Sr_{(y)}TiO_3$, HfZrO$_2$, Hf—Si—O, La-substituted PbTiO$_3$, or PMN-PT based relaxor ferroelectrics.

10. An apparatus comprising:

a 3-input minority gate to receive a first input, a second input, and a third input, wherein the first input is a first operand, and wherein the second input is a second operand, and wherein the third input is a carry-in bit;

a first inverter coupled to an output of the 3-input minority gate; and a 5-input minority gate to receive the first input, the second input, the third input, and two times an output of the 3-input minority gate, wherein the 3-input minority gate comprises:

a first capacitor to receive the first input, the first capacitor coupled to a node;

a second capacitor to receive the second input, the second capacitor coupled to the node;

a third capacitor to receive the third input, wherein the third capacitor is coupled to the node; and a second inverter coupled to the node, wherein the first capacitor, the second capacitor, and the third capacitor include non-linear polar material.

11. The apparatus of claim 10, wherein an output of the first inverter is a carry-out, and wherein an output of the 5-input minority gate is a sum.

12. The apparatus of claim 10, wherein the 3-input minority gate and the 5-input minority gate include non-linear polar material.

13. The apparatus of claim 10, wherein the 5-input minority gate comprises:

a first capacitor to receive the first input, the first capacitor coupled to a node;

a second capacitor to receive the second input, the second capacitor coupled to the node;

a third capacitor to receive the third input, wherein the third capacitor is coupled to the node;

a fourth capacitor to receive the output of the 3-input minority gate, wherein the fourth capacitor is coupled to the node;

a fifth capacitor to receive the output of the 3-input minority gate, wherein the fifth capacitor is coupled to the node; and a inverter coupled to the node, wherein the first capacitor, the second capacitor, the third capacitor, the fourth capacitor, and the fifth capacitor include non-linear polar material.

14. The apparatus of claim 13, wherein the non-linear polar material includes one of: ferroelectric material, paraelectric material, or non-linear dielectric.

15. A system comprising:

a processor circuitry to execute one or more instructions;

a communication interface communicatively coupled to the processor circuitry; and a memory coupled to the processor circuitry, wherein the processor circuitry comprises an adder circuitry which includes:
- a 3-input majority gate to receive a first input, a second input, and a third input, wherein the first input is a first operand, wherein the second input is a second operand, and wherein the third input is a carry-in bit; and
- a 5-input majority gate to receive the first input, the second input, the third input, and two times an inverted output of the 3-input majority gate, wherein the 3-input majority gate and the 5-input majority gate include non-linear polar material, and wherein the 3-input majority gate comprises:
  - a first capacitor to receive the first input, the first capacitor coupled to a node;
  - a second capacitor to receive the second input, the second capacitor coupled to the node; and
  - a third capacitor to receive the third input, wherein the third capacitor is coupled to the node, wherein the first capacitor, the second capacitor, and the third capacitor include non-linear polar material.

16. The system of claim 15, wherein the adder circuitry comprises an inverter coupled to an output of the 3-input majority gate.

17. The system of claim 16, wherein an output of the inverter is coupled to two inputs of the 5-input majority gate, and wherein an output of the 3-input majority gate is a carry-out.

* * * * *